United States Patent [19]
Magome et al.

[11] Patent Number: 5,151,750
[45] Date of Patent: Sep. 29, 1992

[54] ALIGNMENT APPARATUS

[75] Inventors: Nobutaka Magome, Kawasaki; Kazuya Ota, Tokyo; Hideo Mizutani, Yokohama; Kouichiro Komatsu, Tokyo, all of Japan

[73] Assignee: Nikon Corporation, Tokyo, Japan

[21] Appl. No.: 505,504

[22] Filed: Apr. 6, 1990

[30] Foreign Application Priority Data

Apr. 14, 1989 [JP] Japan .................................. 1-94965
Apr. 25, 1989 [JP] Japan .................................. 1-105198

[51] Int. Cl.$^5$ .............................................. G01B 11/00
[52] U.S. Cl. .................................................... 356/401
[58] Field of Search ............... 356/400, 401, 356, 349, 356/363; 250/548, 491.1; 355/53, 43

[56] References Cited

U.S. PATENT DOCUMENTS

| | | | |
|---|---|---|---|
| 3,726,595 | 4/1973 | Matsumoto | 356/111 |
| 4,636,077 | 1/1987 | Nomura et al. | 356/356 |
| 4,650,983 | 3/1987 | Suwa | 250/204 |
| 4,655,598 | 4/1987 | Murakami et al. | 356/400 |
| 4,677,301 | 6/1987 | Tanimoto et al. | 250/548 |
| 4,710,026 | 12/1987 | Magome et al. | 356/349 |
| 4,780,617 | 10/1988 | Umatate et al. | 250/548 |

FOREIGN PATENT DOCUMENTS 0202602 8/1989 Japan .................................. 356/349

Primary Examiner—Davis L. Willis
Assistant Examiner—K. P. Hantis
Attorney, Agent, or Firm—Shapiro and Shapiro

[57] ABSTRACT

There is disclosed an apparatus for transferring a reticle pattern onto a wafer, in which the reticle and the wafer are mutually aligned by irradiating an alignment mark of the wafer with light beams and detecting the optical information from the mark. Depending on the shape of the wafer mark, suitably selected is a first light beam passing through the center of entrance pupil of an objective optical system, or a pair of second light beams passing through the entrance pupil point-symmetrically with respect to its center. The wafer mark consists of a main mark and an auxiliary mark, and the main mark contains a diffraction grating pattern. The second paired light beams and the main mark are used for determining the positional error within an integral fraction of the pitch of the diffraction grating pattern, and the first light beam and the auxiliary mark are used for determining the positional error of an integral multiple of the pitch of the diffraction grating pattern.

13 Claims, 22 Drawing Sheets

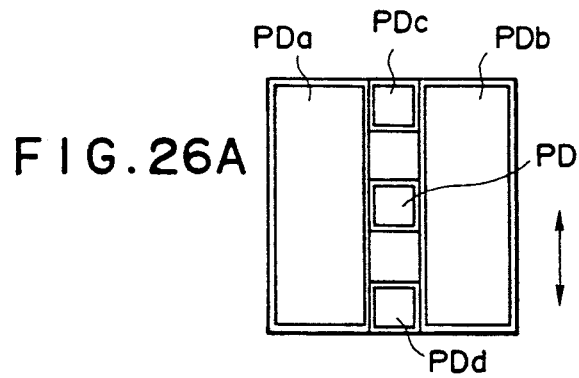
FIG.26A
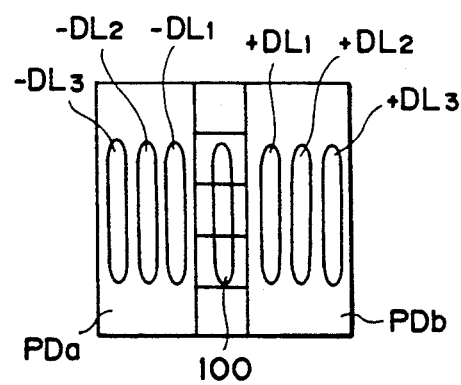
FIG.26C
FIG.26B
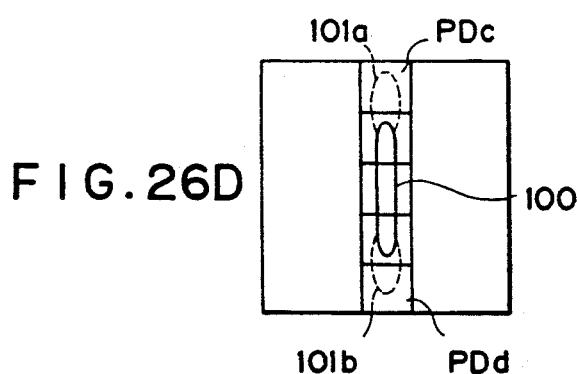
FIG.26D
FIG.26E
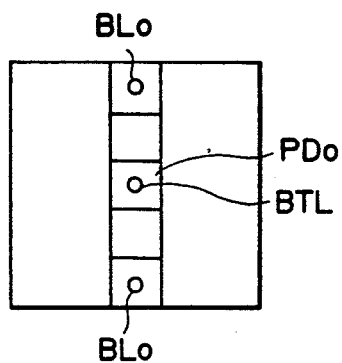
FIG.26F

ALIGNMENT APPARATUS

BACKGROUND OF THE INVENTION

1. Field of the Invention

The present invention relates to an apparatus for aligning a substrate to a desired position in a semiconductor manufacturing apparatus, and more particularly to an alignment apparatus of an exposure apparatus, for a substrate to which the image is to be transferred.

2. Related Background Art

In semiconductor manufacturing apparatus (exposure apparatus, repair apparatus, inspection apparatus etc.), it has conventionally been required to align a semiconductor wafer on which circuit chips are prepared, with a high precision, in said apparatus.

Particularly in the exposure apparatus, it is necessary to precisely detect, in advance, the position of the circuit pattern on the water, in order to precisely align the circuit pattern of a reticle or a mask with that on the wafer.

In a reduction projection exposure apparatus of step-and-repeat method, or so-called stepper, there is provided a laser step alignment (LSA) system of through-the-lens (TTL) method as disclosed in the U.S. Pat. No. 4,677,301 for exactly aligning the projected image of the reticle pattern with the circuit patterns formed in a matrix form on the wafer. Such LSA system has a wide mark detecting range (search range), and is capable of high speed measurement for alignment. For this reason, the enhancement global alignment (LGA) by such LSA system, as disclosed in the U.S. Pat. No. 4,710,026, is principally used for the alignment in the stepper. However, because of the recent progress in the miniturization of circuit patterns, such conventional alignment system has become unable to obtain sufficient precision of measurement for alignment.

Consequently, as an alignment (mark detection) method for obtaining a still higher precision, there has been proposed a method, as disclosed in the U.S. Pat. No. 4,636,077, of projecting static interference fringes on a diffraction grating pattern formed on the wafer, moving said interference fringes relative to the diffraction grating pattern and aligning the wafer based on the intensity change of the interference light generated from said diffraction grating pattern. This method is based on the technology of the U.S. Pat. No. 3,726,595 for measurement of displacement utilizing a fact that the relative positional change between the diffraction grating pattern and the interference fringes unitarily corresponds to the intensity change (sinusoidal level change) of the interference light.

As another method for measuring displacement utilizing the interference fringes and a diffraction grating pattern, the U.S. Pat. No. 4,710,026 discloses a technology of moving interference fringes at a high speed in the direction of pitch of a diffraction grating pattern, and detecting the positional aberration of the diffraction grating pattern (within $\pm \frac{1}{4}$ of the grating pitch or a multiple thereof) from the phase difference between an AC photoelectric signal obtained from the interference beat light coming from said diffraction grating pattern and an AC reference signal corresponding to the moving speed of said interference fringes. This method is also called heterodyne method, because of the utilization of a light beat signal, while the aforementioned method utilizing the static interference fringes is called homodyne method. In said heterodyne method, the phase difference between two AC signals of a same frequency (measured signal and reference signal) corresponds unitarily to the displacement of the diffraction grating pattern, and can be measured with an extremely high resolving power even with a simple phase meter.

As an example, let us consider a case in which the diffraction grating pattern on the wafer has a pitch P of 2 μm (lines and spaces of a width of 1 μm each), and the phase meter has a resolving power $\Delta\theta$ of $\pm 0.5°$. Under certain conditions, $\frac{1}{4}$ of the grating pitch P in the heterodyne method corresponds to a phase difference $\pm 180°$, so that the resolving power $\Delta X$ of the measurement of displacement is determined as follows:

$$\Delta X/\Delta\theta = (P/4)/180$$

Consequently, under the above-mentioned conditions, the resolving power $\Delta X$ is as high as 0.0014 μm. Also stability of measurement is high because the phase difference is obtained from the average of signal waves over a certain period (in the order of milliseconds). Furthermore this method is not affected strongly by the fluctuation of the signal level as in the homodyne method, since the alignment is not dependent on the change in signal level but on the phase change.

However, as the information on positional aberration obtained in the conventional homodyne or heterodyne method is repeated at every $\frac{1}{2}$ of the pitch P of the diffraction grating pattern, there will result an alignment error equal to a multiple of P/2 if the pre-alignment of the pattern is insufficient. Consequently a pre-alignment is required for the diffraction grating pattern within a precision of $\pm 0.5$ μm for a pitch P=2 μm. In such mark detecting method, the pitch P of the diffraction grating pattern will become finer in the future, and in that case especially, conventional mechanical prealignment will not be adequate.

SUMMARY OF THE INVENTION

An object of the present invention is to provide an alignment apparatus capable of alignment with a high speed and a high precision.

Another object of the present invention is to achieve a rapid mark detecting operation in an alignment apparatus provided with an alignment system which has a high resolving power but a narrow range of measurement of aberration in mark position.

The alignment apparatus of the present invention is applicable to an apparatus for transferring a reticle pattern onto a wafer through an objective optical system, and comprises means for emitting a first light beam passing the approximate center of the entrance pupil of the objective optical system and a pair of second light beams passing said objective optical system substantially point symmetrically with respect to the center of said first light beam on said entrance pupil, means for passing said first light beam or second light beams through the entrance pupil according to the form of the alignment mark formed on the wafer, and a photoelectric detector for receiving the optical information generated by said alignment mark on the wafer through the objective optical system, wherein the relative alignment between the reticle and the wafer is achieved, based on the photoelectric signal from said photoelectric detector.

The alignment apparatus of the present invention is so constructed as to rely on both first and second mark detecting means for detecting the alignment marks on the wafer, including a main mark consisting of a diffraction grating pattern and an auxiliary mark formed as a part thereof or separately. The first mark detecting means has a first detecting area smaller than the alignment mark, and serves to detect a local part of the alignment mark, particularly the mark information from the auxiliary mark, by relative scanning with the alignment mark, thereby determining a positional aberration corresponding to a multiple of the diffraction grating pattern. The second mark detecting means detects the mark information (such as interference beat light) from the substantially entire alignment mark, as in the heterodyne or homodyne method, and determines a positional aberration within 1/m (m being an integer equal to or larger than 1) of the pitch P of the diffraction grating pattern.

The moving coordinate system of a stage supporting the wafer is correlated with an arbitrary point on the wafer, for example the center point of a shot, based on the information on aberration of the mark position obtained from these two systems.

The alignment apparatus of the present invention is applicable to exposure apparatus by projection, contact or proximity exposure, or by X-ray exposure.

BRIEF DESCRIPTION OF THE DRAWINGS

FIGS. 26A to 26F are views showing the states of light received on the photoelectric detector;

DETAILED DESCRIPTION OF THE PREFERRED EMBODIMENTS

In the following there will be explained in detail a first embodiment of the present invention with reference to FIGS. 1 to 6.

Figure 2:
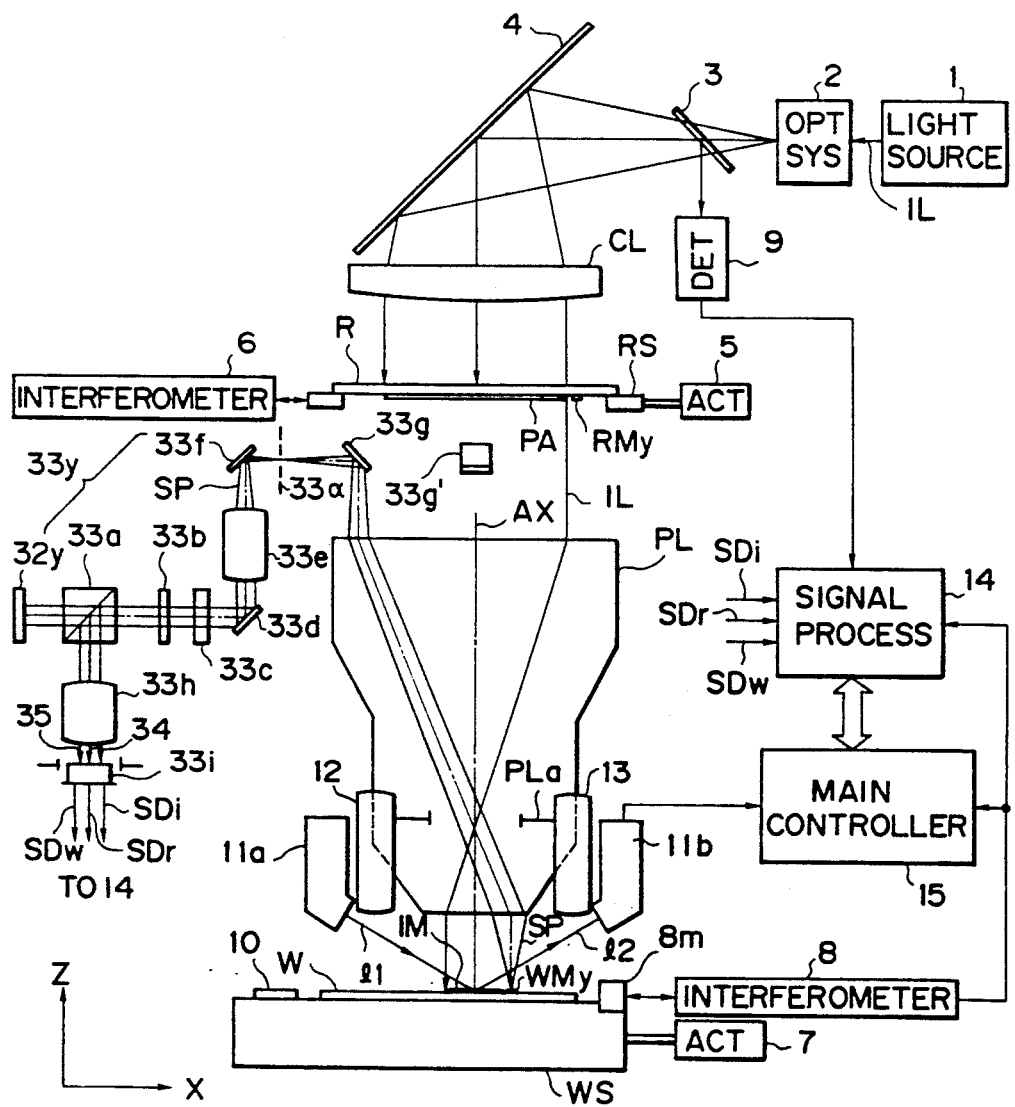
FIG. 2 is a schematic elevation view of a stepper equipped with the alignment optical system shown in FIG. 1.

Referring to FIG. 2, an illuminating light source 1 is composed for example of an ultra high pressure mercury lamp or an excimer laser unit, and generates illuminating light IL of a wavelength actinic to a photoresist layer (exposure wavelength), such as g-line, i-line or KrF excimer laser beam. Said illuminating light IL enters an illuminating optical system 2, including an optical integrator such as a fly's eye lens. After being made uniform and subjected to the reduction of speckles in the illuminating optical system 2, the illuminating light IL is transmitted by a beam splitter 3 and a mirror 4 and enters a main condenser lens CL, thus uniformly illuminating a pattern area PA of a reticle R placed on a reticle stage RS. Said reticle R is two-dimensionally displaced and rotated in the horizontal plane by an actuator 5, and the position of said reticle R is detected, on real-time basis, by a laser interferometer 6 with a resolving power of about 0.02 $\mu$m. Beside the pattern area PA on the reticle R, there are formed reticle marks RMx, RMy (transparent rectangular windows, of which RMy alone is illustrated).

The illuminating light IL transmitted by the pattern area PA enters a projection lens PL which is telecentric on both sides (or on one side) and which projects, onto a wafer W, an image of the circuit pattern formed in the pattern area PA. The wafer surface is covered with a photoresist layer, and substantially coincides with the image plane IM. Said wafer is placed, by means of an unrepresented wafer holder ($\theta$ table), on a wafer stage WS, which moves two-dimensionally in X and Y directions in step-and-repeat method and slightly in the Z-direction, by means of an actuator 7. The position of the wafer stage WS in the X and Y-directions is detected on real time basis with a resolving power of about 0.02 $\mu$m by a laser interferometer 8, and, for this purpose, a movable mirror 8m for reflecting the laser beam from said laser interferometer 8 is fixed on an end of the wafer stage WS.

Figure 3A:
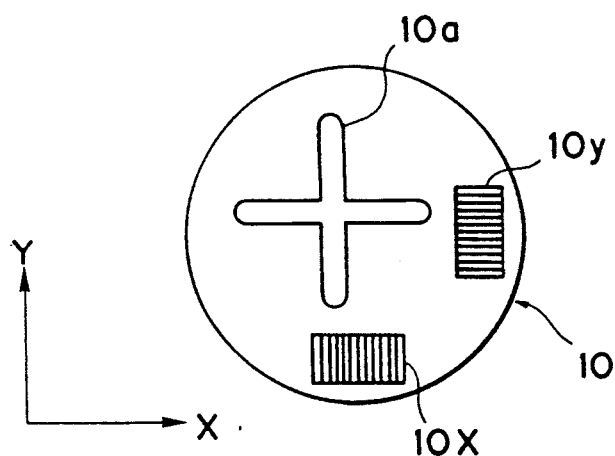
FIG. 3A is a plan view of a fiducial mark on a wafer stage.

The wafer stage WS is provided with a glass substrate 10 having a fiducial mark, on a plane substantially same as the surface of the wafer. The fiducial mark is composed, as shown in FIG. 3A, of a cross-shaped translucent slit pattern 10a and reference marks 10x, 10y formed by surface irregularity of a reflective chromium layer.

Figure 3B:
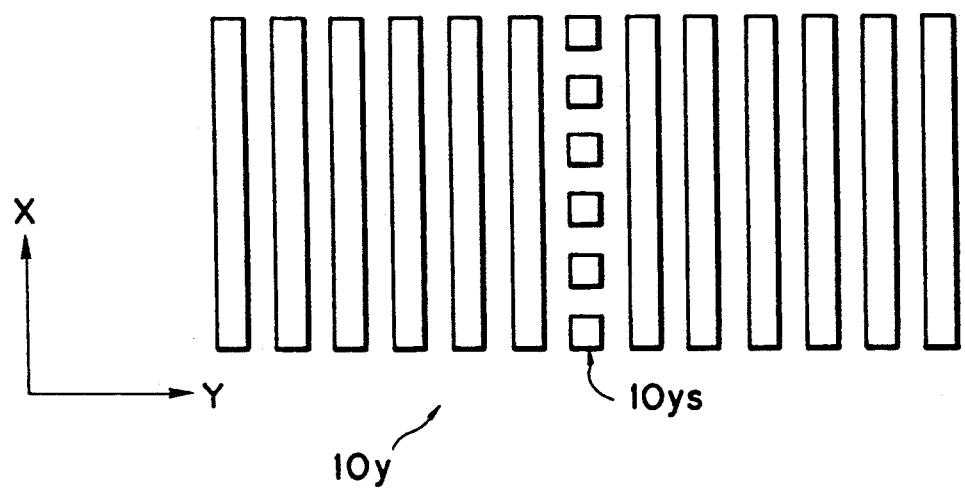
FIG. 3B is a magnified plan view of a part of said fiducial mark.

FIG. 3B schematically shows the structure of the reference mark 10y, which is composed of a diffraction grating mark 10ys (hereinafter called LSA mark) consisting of plural dot marks arranged in the X-direction, and a bar pattern consisting of plural (12 being illustrated) bars extending in the X-direction, and is arranged in the Y-direction around the LSA mark 10ys so as to form a line-and-space pattern for example of 4 μm. The cross-shaped pattern 10a is illuminated from below the substrate 10 by the illuminating light (exposure light) transmitted by an unrepresented optical fiber. The light transmitted by the cross pattern 10a forms, by the projection lens PL, a projected image of said cross pattern 10a on the bottom face (pattern bearing face) of the reticle. The light transmitted by the reticle mark is reflected by the mirror 4 and the beam splitter 3, and is received by a photoelectric detector 9 positioned on a plane conjugate with the pupil of the projection lens.

There is also provided a focus state detection system consisting, as disclosed in the U.S. Pat. No. 4,650,983, of an irradiating optical system 11a for providing a light beam 11, oblique to the optical axis AX, for forming a pinhole or slit image on the image plane IM of the projection lens, and a receiving optical system 11b for receiving a light beam 12 reflected by the wafer surface. A wafer alignment system 12, 13 provided in fixed manner relative to the projection lens for the purpose of wafer mark detection causes, as disclosed in the aforementioned U.S. Pat. No. 4,677,301, a small vibration of a stripe-shaped spot light on the diffraction grating mark of the wafer, and effects synchronized detection of the photoelectric signal obtained from the light diffracted or scattered by said mark. The wafer marks WMx, WMy have LSA marks WMxs, WMys shaped same as the reference marks 10x, 10y shown in FIG. 3B, in association with the chip C.

Figure 1:
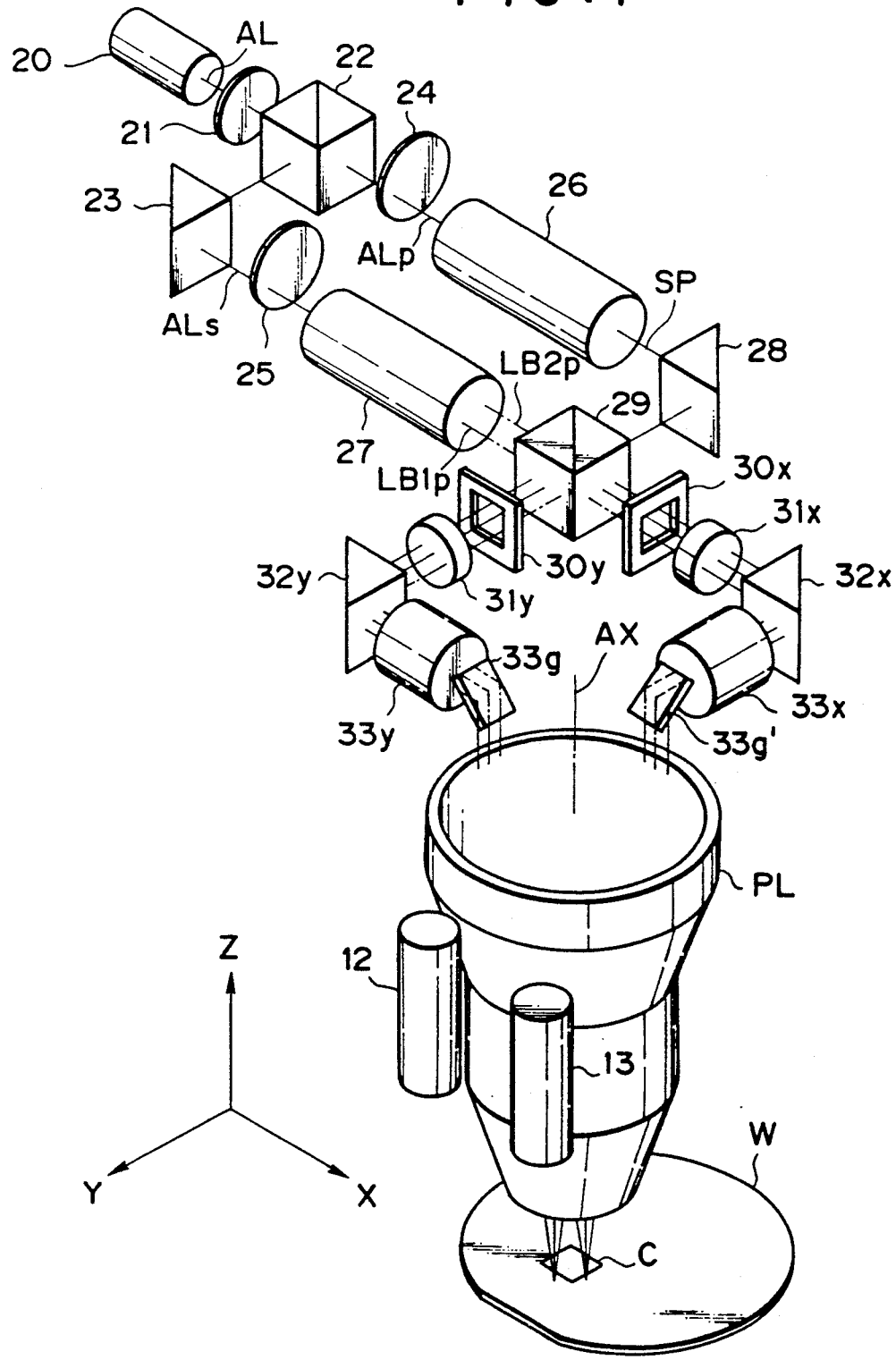
FIG. 1 is a perspective view of an alignment optical system constituting a first embodiment of the present invention.
Figure 4:
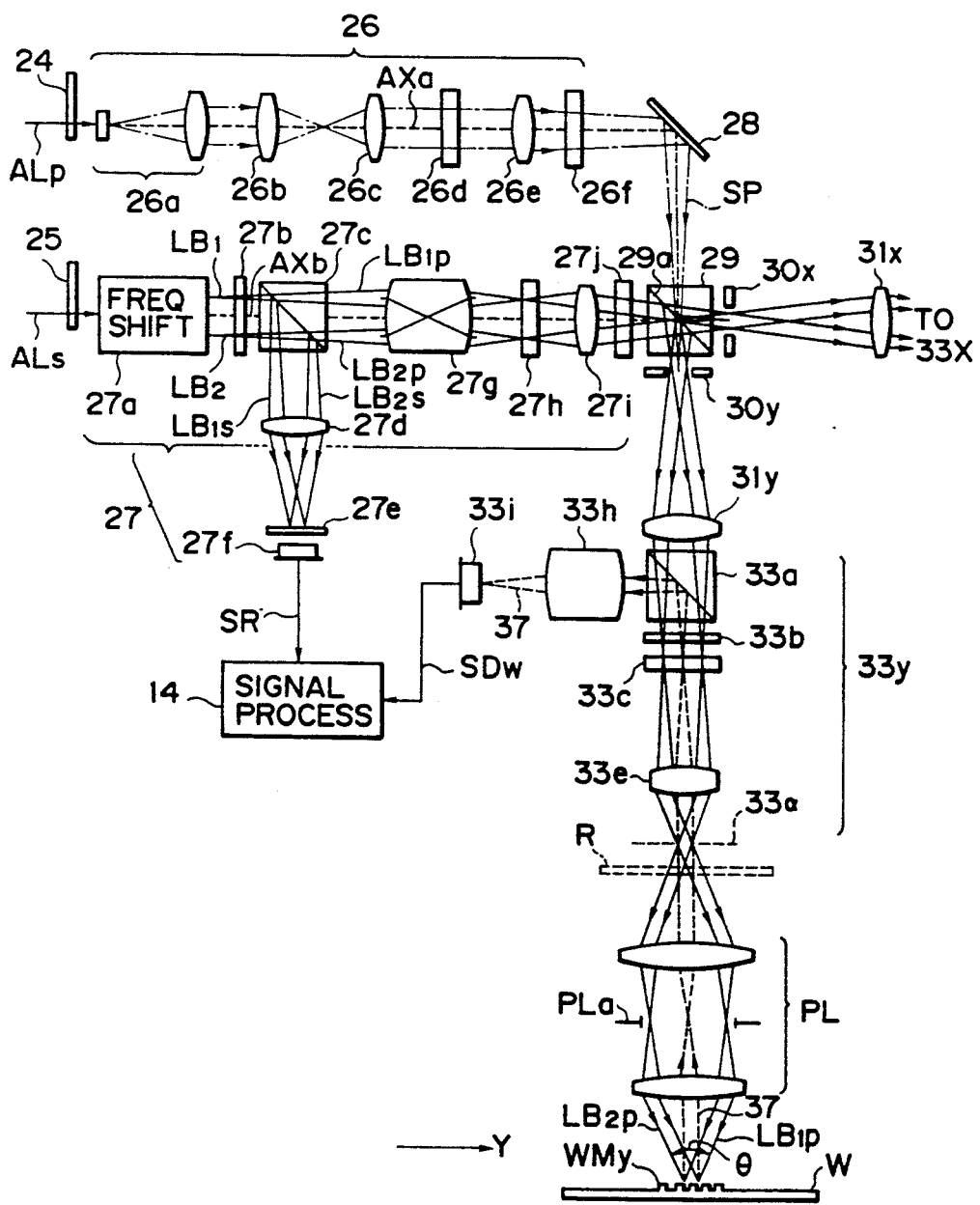
FIG. 4 is a detailed plan view of the alignment optical system shown in FIG. 1.

Now reference is made to FIGS. 1 and 4, for explaining the alignment optical system of the present embodiment, which consists of a LIA system and a LSA system, herein collectively called a site-by-site alignment (SSA) system. FIG. 1 shows the outline of said SSA system, and FIG. 4 shows the details of principal portions thereof. For the purpose of simplicity, a part of the mirrors shown in FIGS. 1 or 2 is omitted in FIG. 4.

Referring to FIG. 1, an alignment light beam AL of a predetermined wavelength, linearly polarized in perpendicular directions, is emitted from a laser unit 20, guided through a wave plane rotating plate 21 to a polarizing beam splitter 22 and is split into a beam ALp of the P-polarized component parallel to the plane of drawing, and a beam ALs of the S-polarized component perpendicular thereto. Said laser unit 20 preferably provides the laser beam of a wavelength scarcely actinic to the photoresist layer, such as a He-Ne laser.

The beam ALp transmitted by the polarizing beam splitter 22 enters, through a shutter 24, a first beam shaping optical system 26 (hereinafter called LSA optical system) including for example a cylindrical lens. On the other hand, the beam ALs reflected by said splitter 22 enters, through a mirror 23 and a shutter 25, a second beam shaping optical system 27 (hereinafter called LIA optical system). The shutters 24, 25 are composed, for example, of 4-blade rotary shutters which are controlled in mutual synchronization so as to alternately open the paths for the beams ALp and ALs.

Said shutters 24, 25 may be arbitrarily positioned between said polarizing beam splitter 22 and a beam splitter 29 to be explained later. Also if the wave plane rotating plate 21 is composed of a rotatable ½-wavelength plate, the beam AL is split with an intensity ratio corresponding to the rotating angle of said ½-wavelength plate, so that the intensities of the beams ALp, ALs can be adequately regulated according to the requirements of the LSA optical system 26 and the LIA optical system 27. This fact also means that the wave plane rotating plate 21 and the polarizing beam splitter 22 can perform the function of shutter, thereby dispensing with the shutters 24, 25. Also the use of the ½-wavelength plate provides an advantage of absence of light loss. However, in consideration of the ease of light intensity control, the present embodiment employs the shutters 24, 25, in combination with a ½-wavelength plate fixed at a predetermined angle, as the wave plane rotating plate 21. Said wave plane rotating plate 21 and the polarizing beam splitter 22 are preferably inclined by about 1° with respect to the optical axis of the laser unit 20, in order to prevent the backtalk phenomenon caused by the reflected light on the laser unit.

As shown in FIG. 4, the beam ALp transmitted by the shutter 24 is expanded to a predetermined beam diameter by a beam expander 26a, then shaped into an oval beam SP by a cylindrical lens 26b, and enters a flat plate 26f with parallel faces through a first relay lens 26c, a flat plate 26d with parallel faces and a second relay lens 26e. Said parallel-faced flat plates 26d, 26f are both two-dimensionally inclinable with respect to the optical axis AXa, and said second relay lens 26e is so positioned that the image-side focal point thereof coincides with the object-side focal point of lenses 31x, 31y to be explained later. The LSA optical system 26 is composed of these components 26a–26f.

The oval beam SP transmitted by the flat plate 26f is reflected by a mirror 28, and then divided into two beams of same intensity (amplitude division) by a beam splitter 29. The obtained beams are converged into slit form on field diaphragms 30x, 30y positioned at the image-side focal point of the second relay lens 26e, and reach position detecting systems 31x, 31y through lenses 31x, 31y and mirrors 32x, 32y as shown in FIG. 1. The oval beams SP transmitted by the position detecting systems 33x, 33y reach the incident pupil PLa of the projection lens PL respectively through mirrors 33g', 33g, and reach the wafer passing through the approximate center of said incident pupil PLa. These two beams form, on the wafer, stripe-shaped beam spots extending respectively in the Y and X directions and radially with respect to the optical axis. Said two oval beams are extended in the X and Y directions on the incident pupil PLa.

In the position detecting system 33y shown in FIG. 2, the oval beam SP (P-polarized) is guided through a polarizing beam splitter 33a, a ¼-wavelength plate 33b a parallel-faced flat plate 33c capable of two-dimensional inclination, and a mirror 33d, and reaches an objective lens 33e. The oval beam SP circularly polarized by the ¼-wavelength plate 33b is reflected by a mirror 33f, then converges by the objective lens 33e on a focal plane 33α (optical equivalent to wafer) of the position detecting system 33y, and forms a beam spot on the wafer through a mirror 33g and the projection lens PL.

When the spot of the beam SP scans the wafer in the Y-direction, the LSA mark WMys provides, in addition to the normal reflected light (0-th order light) 34, diffracted light (1st order or higher order) 35 and scattered light 36. Such optical information (circularly polarized) is again transmitted by the projection lens PL, changed to S-polarized state by the ¼-wavelength plate 33b, reflected by the polarizing beam splitter 33a, further guided through a pupil relay system 33h and received by a photoelectric detector 33i positioned on a plane conjugate with the pupil. Said detector 33i detects the higher-order light, for example ±1st -3rd order lights 35, and the scattered light 36, and provides a signal processing circuit 14 with photoelectric signals SDi, SDr corresponding the intensities of said diffracted light 35 and scattered light 36.

In the following there will be explained the structure of the LIA optical system 27. Refering to FIG. 4, the beam ALs transmitted by the shutter 25 enters a frequency shifter 27a consisting for example of two acoustoopical modulators, thereby being converted into two linearly polarized orthogonal beams LB1, LB2 of mutually different frequencies. The structure of the frequency shifter 27a is shown in FIG. 5.

Figure 5:
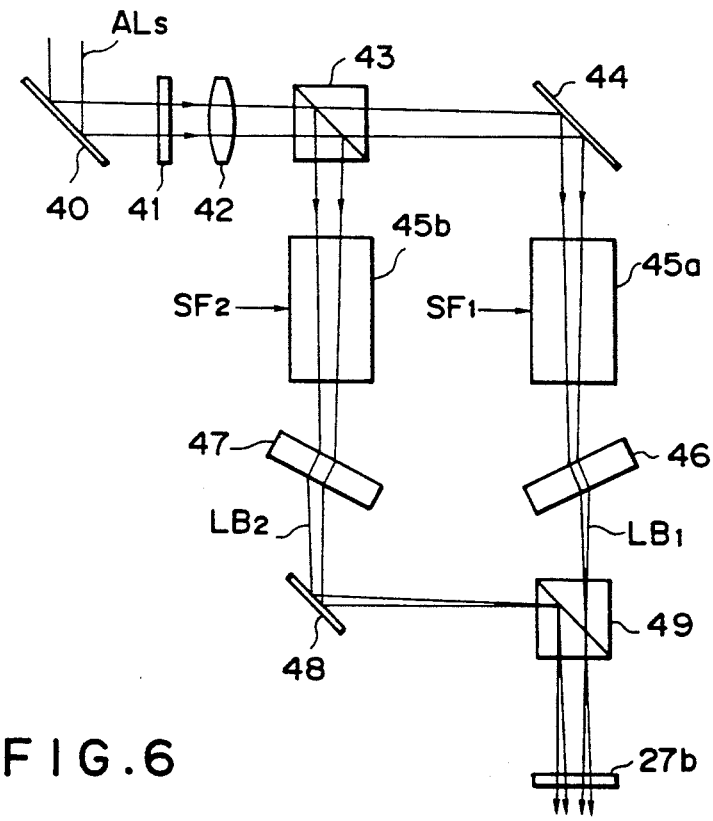
FIG. 5 is an optical path chart showing the structure of a frequency shifter.

Referring to FIG. 5, the beam ALs (S-polarized) is reflected by a mirror 40, then transmitted by a ¼-wavelength plate 41 and a lens 42, and subjected to wave plane division by a polarizing beam splitter 43 into a P-polarized beam and an S-polarized beam of a same intensity. The P-polarized beam transmitted by said beam splitter 43 is reflected by a mirror 44 and enters a first acoustooptical modulcator (AOM) 45a, while the S-polarized beam reflected by the beam splitter 43 enters a second acoustooptical modulator (AOM) 45b.

The AOM 45a is driven with a high-frequency signal SF1 of a frequency f1, and generates a primary beam LB1 deflected by a diffraction angle determined by said frequency f1. On the other hand, the AOM 45b is driven by a high-frequency signal SF2 of a frequency f2 which is different by Δf from the frequency f1 for the beam LB1, and generates a primary beam LB2 deflected by a diffraction angle determined by said frequency f2. Other beams than the primary beams emitted from the AOM's 45a, 45b are intercepted by suitably positioned slits (not shown). The driving frequencies f1, f2 and the frequency difference Δf preferably satisfy relations f1>>Δf and f2>>Δf, and the upper limit of Δf is determined by the response characteristics of the photoelectric detector 33i etc. In the present embodiment, the driving frequencies f1, f2 of the AOM's 45a, 45b are respectively selected, for example, at 80.025 MHz and 80.000 MHz while the frequency difference thereof is selected as low as 25 KHz, so that two AOM's 45a, 45b have a same diffraction angle for the primary diffracted light.

The beam LB1 modulated with the frequency f1 in the AOM 45a enters, through a parallel-faces flat plate 46, a polarizing beam splitter 49 positioned at the pupil plane of the SSA system, while the beam LB2 modulated with the frequency f2 by the AOM 45b enters, through a parallel-faced flat plate 47 and a mirror 48, said beam splitter 49. In order that the beams LB1 and LB2 emerge with a predetermined spacing therebetween from the beam splitter 49, arbitrarily inclinable flat plates 46, 47 are provided at desired angles with respect to the beams LB1, LB2. Said beams LB1, LB2 emerge from the beam splitter 49, or the frequency shifter 27a, symmetrically with respect to the optical axis AXb of the LIA optical system 27 as shown in FIG. 4, by the angular adjustment of said parallel-faced flat plates 46, 47.

The beam LB1 (P-polarized, frequency f1), and the beam LB2 (S-polarized, frequency f2), both emerging from the frequency shifter 27a, are subjected to rotation of polarized direction by 45° by a ½-wavelength plate 27b, and enter a polarizing beam splitter 27c, whereby said beam LB1 is wave-plane divided into a P-polarized beam LB1p and an S-polarized beam LB2s of a frequency f1, while said beam LB2 is divided into a P-polarized beam LB2p and an S-polarized beam LB2s of a frequency f2. Two S-polarized beams LB1s (frequency f1) and LB2s (frequency f2) reflected by the beam splitter 27c are guided through an inverted Fourier conversion lens system 27d for converting the pupil into an image plane, and enter a reference diffraction grating 27e, fixed on the apparatus from two different directions with a predetermined mutual angle θ, thus mutually crossing on said grating. A photoelectric detector 27f receives the diffracted light (interfered light) other than the 0-th order light transmitted by said diffraction grating 27e, and generates a sinusoidal photoelectric signal SR corresponding to the intensity of the diffracted light. Said signal SR is a light beat signal having a frequency proportional to the frequency difference Δf of the beams LB1s, LB2s.

On the other hand, two P-polarized beams LB1p (frequency f1) and LB2p (frequency f2) transmitted by the polarizing beam splitter 27c are collimated and mutually cross in a pupil relay system 27g, and emerge therefrom, providing principal rays parallel to the optical axis AXb of the LIA optical system 27 and forming two spots, on the pupil plane, which are point symmetrical with respect to the optical axis AXb. Said beams LB1p, LB2p pass through a parallel-faced flat plate 27h positioned on said pupil plane or in the vicinity thereof, then converted into collimated light beams inclined by a predetermined angle by means of a lens 27i, and enter a parallel-faced flat plate 27j.

Said flat plates 27h, 27j are rendered inclinable with respect to the optical axis AXb of the LIA optical system 27, and the lens 27i is so positioned that the image side focal plane thereof coincides with the object-side focal point of lenses 31x, 31y.

The two beams LB1p, LB2p emerging from the LIA optical system 27 are subjected to amplitude division by the beam splitter 29, as in the spots of the above-mentioned beam SP, then mutually cross in field diaphragms 30x, 30y, and enter position detecting systems 33x, 33y respectively through lenses 31x, 31y. Then said beams LB1p, LB2p mutually cross on a focal plane 33a, and enter the wafer from two different directions of a mutual angle θ.

On the incident pupil PLa, the beams LB1p, LB2p form spots on two positions which are point symmetrical in the Y-direction, with respect to the beam SP. Also the crossing angle θ of the beams LB1p, LB2p on the wafer does not exceed the numerical aperture of the exit side of the projection lens PL. Also the irradiating areas of the alignment light on the wafer are determined by the field diaphragms 30x, 30y.

The mutually crossing beams LB1p, LB2p, upon entering the wafer mark WMy, form one-dimensional interference fringes of a pitch P' equal to ½ of the grating pitch P, on the wafer. Said interference fringes move, in the direction of pitch of the wafer mark WMy (Y-direction), with a speed V determined by the frequency difference Δf of the beams LB1p, LB2p and represented by V=Δf·P'. The interference between said moving interference fringes and the grating mark WMy on the wafer generates ±1st-order diffraction light 37 travelling on the optical axis AX. Said diffracted light 37 is a beat wave periodically repeating light and dark portions according to the movement of the interference fringes. Said diffracted light 37 is transmitted by the projection lens PL, ¼-wavelength plate etc., then reflected by a beam splitter 33a, further transmitted by a pupil relay system 33h and received by a photoelectric detector 33i, which sends a sinusoidal beat signal SDw corresponding to the intensity changes of the interference fringes, to the signal processing circuit 14.

Figure 6:
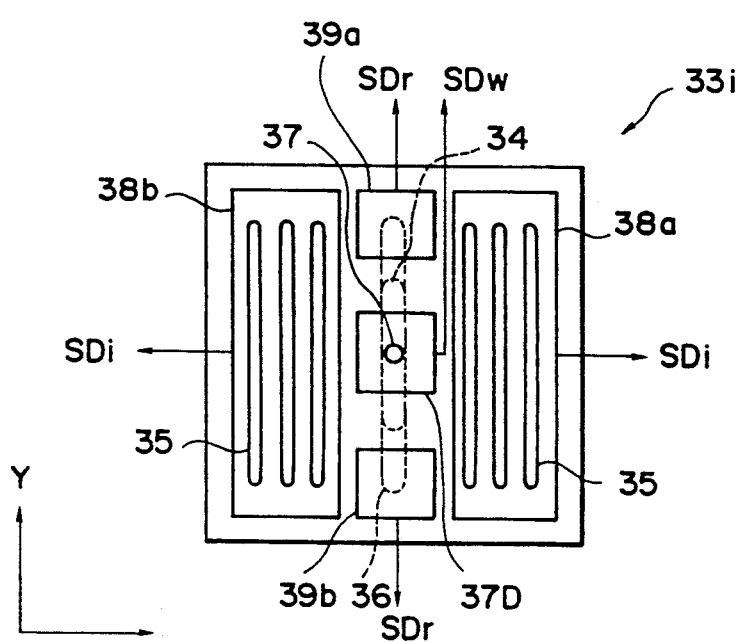
FIG. 6 is a plan view of a photoelectric detector.

FIG. 6 shows the schematic structure of said photoelectric detector 33i, composed of a composite photosensor having light-receiving areas 38a, 38b corresponding to the distribution of the ±1st–3rd diffracted light 35 generated from the LSA mark WMys by the irradiation of the beam SP; light-receiving areas 39a, 39b corresponding to the distribution of the scattered light 36 generated from the edges of said mark; and a light-receiving area 37D for receiving the diffracted light 37 generated from the wafer mark WMy by the irradiation with the beams LB1p, LB2p. The irradiation of the LSA mark WMys with the light spot SP generates the normal reflected light 34 and the scattered light 36 in addition to the diffracted light 35 as explained above, but such normal reflected light 34 and scattered light 36 do not mix with the diffracted light 37 on the light-receiving area 37D because, in the present embodiment, the shutters 24, 25 are so controlled that the beam SP does not fall onto the wafer simultaneously with the beams LB1p, LB2p.

When the beam SP from said LSA system is selected, the signal processing circuit 14 receives the photoelectric signal SDi (or SDr) from the photoelectric detector 33i and the position signal from the laser interferometer 8, samples said signal SDi or SDr in synchronization with up-down pulse signals generated at every unit movement (0.02 μm) of the wafer stage WS, stores thus sampled values in succession in a memory after conversion into digital values, and detects the position of the wafer mark WMy in the Y-direction by a predetermined processing. Said signal processing circuit 14 preferably processes the photoelectric signals SDi, SDr in parallel manner and determines the position of the wafer mark WMy from the results of detection of both signals.

When the beams LB1p, LB2p from the LIA system are selected, the signal processing circuit 14 receives the beat signal SDw from the photoelectric detector 33i and the beat signal SR from the detector 27f as the reference signal, and detects the phase difference of said beat signals SR, SDw, utilizing the signal SR as reference. Said phase difference (±180°) corresponds to the relative positional aberration within ½ of the pitch P of the wafer mark WMy. If the pitch P of the wafer marks WMx, WMy is 8 μm and the resolving power of phase detection of the signal processing circuit 14 is 0.2°, the resolving power for measurement of positional aberration becomes as small as 0.0022 μm. In practice, due to the influence of noises, the resolving power is about 0.0044 μm (or 0.4° in phase). This detection is based on so-called heterodyne method, which allows highly precise detection of positional aberration even in the stationary state, if the positional error of wafer is within P/2.

A main control unit 15 effects the control of the shutters 24, 25, the alignment of reticle and wafer by sending commands to drive units 5, 7 based on the information on mark position and phase difference from the signal processing circuit 14, and positional information from the laser interferometers 6, 8, and the control of the entire apparatus including the focus state detecting system 11 and the wafer-alignment systems 12, 13.

The optical axis AXa of the LSA optical system 26 has to precisely coincide with the optical axis AXb of the LIA optical system 27, in the optical members positioned behind the beam splitter 29, such as the field diaphragms 30x, 30y, position detecting systems 39x, 39y etc. For this reason, the beam splitter 29 is so positioned that the beam SP and the beams LB1p, LB2p enter the splitting face 29a substantially perpendicularly on a same plane (parallel to the reticle R). It is however difficult to precisely match the optical axes AXa and AXb by the adjustment of position of the beam splitter 29 only. Consequently, in the present embodiment, fine adjustments are made on the inclination angle of the parallel-faced flat plates 26f, 27j provided in the LSA optical system and in the LIA optical system 27, at the manufacture or initialization of the stepper.

Also the inclination of the parallel-faced flat plates 46, 47 shown in FIG. 5 causes two-dimensional movement of the spots of the beams LB1, LB2, formed across the optical axis AX, on the pupil plane of the SSA system, for example at the entrance pupil PLa. Stated differently, the distance of the spots of the beams LB1p, LB2p at the entrance pupil, or the crossing angle θ at the wafer marks WMx, WMy is defined by the inclination angles of said flat plates 46, 47. Consequently, in the present embodiment, the crossing angle θ of the beams LB1p, LB2p is adjusted by inclining the flat plates 46, 47 according to the wavelength of the beam ALs. In this operation, at least one of the flat plates 46, 47 is so inclined that the direction of pitch of the interference fringes formed by the beams LB1p, LB2p becomes substantially parallel to a line connecting the spots of said beams LB1p, LB2p at the entrance pupil PLa, while the crossing angle θ is maintained constant (namely the distance of two spots at the entrance pupil is maintained constant). Consequently, the direction of pitch of the interference fringes exactly coincides with that of the wafer mark on the wafer, so that the beat signal SDW can be obtained with a high contrast.

The above-mentioned parallel-faced flat plates 26d, 27h are positioned on the pupil plane of the SSA system, or a plane conjugate therewith, or in the vicinity thereof. Consequently, the inclinations of the principal ray of the beam SP at the exit side of the projection lens PL and of a principal ray of the beams LB1p, LB2p equally dividing said beams with respect to the optical axis AX (said inclinations being hereinafter called telecentric inclinations) can be regulated by two-dimensionally moving the spots of the beam SP and of the beams LB1p, LB2p at the entrance pupil PLa, by varying the inclinations of said flat plates 26d, 27h. Thus inclination angles of the flat plates 26d, 27h are adjusted, for example at the initialization of the stepper, in such a manner that said telecentric inclinations of the beam SP and beams LB1p, LB2p are zero or within a predetermined tolerances. Upon completion of adjustment of the flat plates 46, 47, 26d and 27h, the line connecting the centers of the beam SP and the beams LB1p, LB2p at the entrance pupil becomes substantially parallel to the direction of pitch of the wafer mark.

Inclination of the above-mentioned flat plates 46, 47 by a same angle in a same direction causes, at the entrance pupil PLa, two-dimensional movement of the spots of the beams LB1p, LB2p depending on the angle of said inclinations, with a constant distance therebetween. Consequently the flat plates 46, 47 also have the function of correcting the telecentric inclinations, and the flat plate 27h can be dispensed with. However, in the present embodiment, in consideration of the ease of adjustment and the time required therefor, the parallel-faced flat plates 46, 47 are used exclusively for adjusting the crossing angle θ of the beams LB1p, LB2p, or the pitch of the interference fringes, while the flat plate 27h is provided for correcting the telecentric inclinations. The adjustments of the inclination angles of the flat plates 46, 47 and 27h are conducted so as to satisfy the following equation (1):

$$\sin \theta a = \sin \theta b = n\lambda/P(n=1,2,\ldots) \qquad (1)$$

wherein λ is the wavelength of the beams LB1p and LB2p, P is the pitch of the wafer mark WMy, and θa, θb are incident angles, with respect to the optical axis AX, of the beams LB1p, LB2p to the wafer (crossing angle θ = θa + θb). Thus the incident angles θa, θb of the beams LB1p, LB2p are maintained symmetric, while the telecentric inclinations are corrected, and the diffracted light 37 generated from the wafer mark always proceeds on the optical axis AX.

Also the parallel-faced flat plate 33c shown in FIGS. 2 and 4 is positioned in the vicinity of a plane conjugate with the pupil of the SSA system, and has the function of correcting the telecentric inclinations, like the flat plates 26d, 27h. It is to be noted in particular that the flat plate 33c is positioned within the position detecting system 33y and is capable of simultaneously moving, at the entrance pupil PLa, the spots of the beam SP and the beams LB1p, LB2p by a same amount. Since the telecentric inclinations of these beams can be considered same at the wafer side of the projection lens PL, it is possible to simultaneously correct these telecentric inclinations by adjusting the inclination angle of said flat plate 33c according to the telecentric inclination of either beam.

In the present embodiment, the inclination angle of the flat plate 33c is not adjusted at the initialization of the stepper, and the telecentric inclinations of the beam SP and the beams LB1p, LB2p are corrected by the adjustment of inclination angles of the flat plates 26d, 27h while said flat plate 33c is maintained precisely orthogonal to the optical axis (AXa, AXb) of the SSA system.

Now reference is made to FIGS. 7 to 11 for explaining the adjustments and the mark detecting operation of the present embodiment.

Step 100—Telecentricity checking:

The main control unit 15 moves the wafer stage WS through the drive unit 7 in such a manner that the reference mark 10y of the glass substrate 10 coincides with the irradiating position of the beams LB1p, LB2p. Then, while the reference mark 10y is irradiated by the beams LB1p, LB2p emitted from the position detecting system 33y, the wafer stage WS is vertically moved in the Z-direction within a predetermined range, with the monitoring of the distance between the projection lens PL and the substrate 10 in the Z-direction by the focus state detecting system 11. The signal processing circuit 14 detects the change in the phase difference φw between the beam signal SR from the photoelectric detector 27f and the beat signal SDw from the photoelectric detector 33i. The main control unit 15 samples the change in the phase difference φw at every small displacement of the Z-stage in the Z-direction based on the information on phase difference (change in phase difference φw) and on the positional information from the focus state detecting system 11, and determines characteristics VT as shown in FIG. 9.

Figure 9:
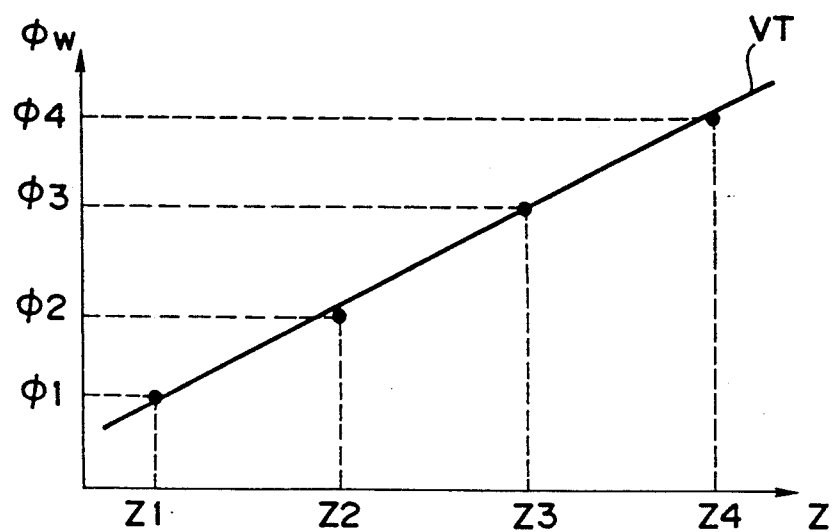
FIG. 9 is a chart showing the measured data of telecentricity.
Figure 10:
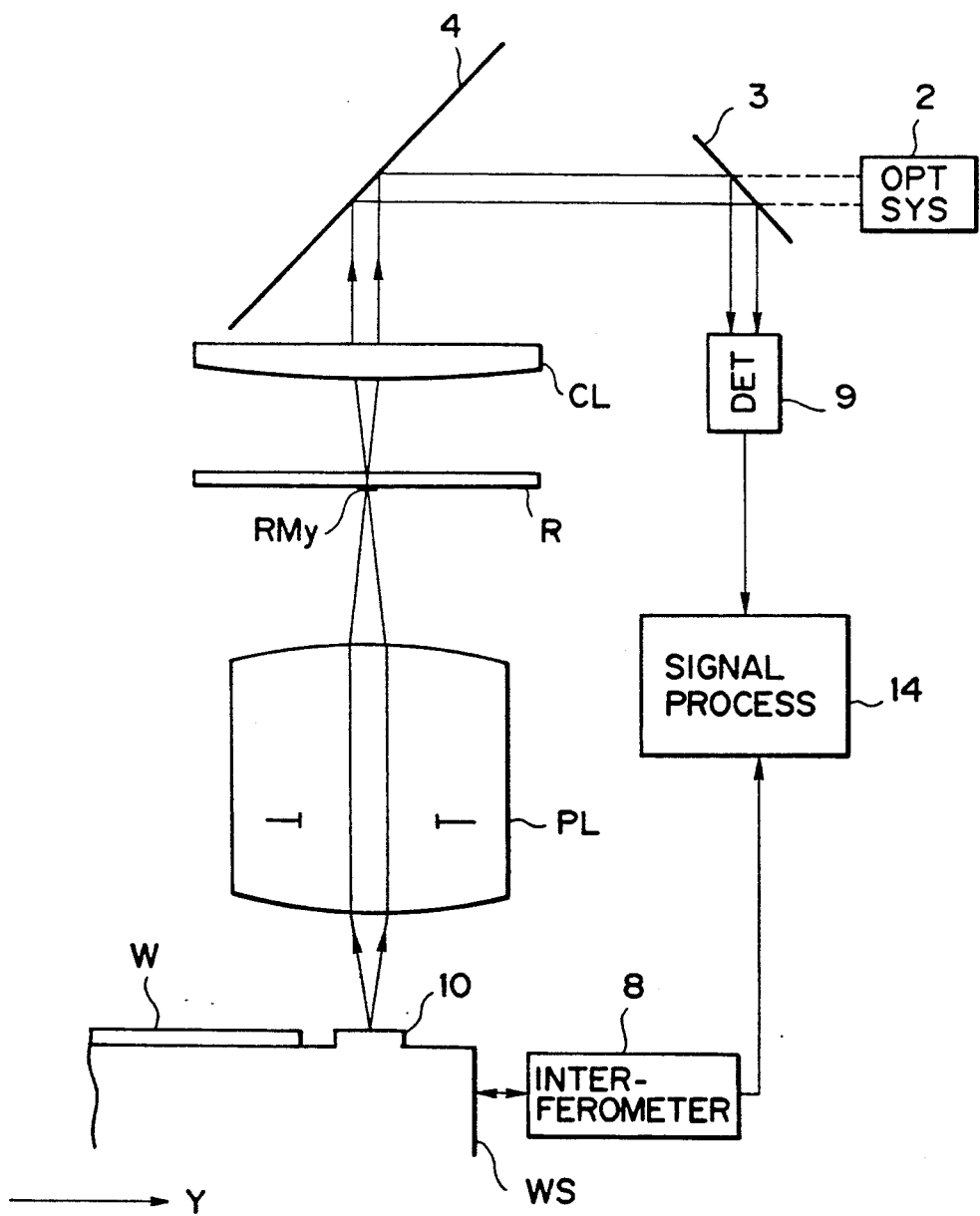
FIG. 10 is a schematic view of the apparatus shown in FIG. 2.

In FIG. 9, the abscissa indicates the Z-position of the substrate 10 while the ordinate indicates the phase difference φw, and the substrate comes closest to the projection lens PL at a position Z4. Thus, based on the characteristic VT shown in FIG. 9, the main control unit 15 determines the telecentricity of the beams LB1p, LB2p, or the inclination ΔM of the characteristic VT in FIG. 9, from the following equation (2):

$$\Delta M = \Delta L/|Z1 - Z4| \qquad (2)$$

wherein ΔL is the lateral aberration in the Y-direction corresponding to the phase difference |Z1 − Z4|.

Then the main control unit 15 discriminates whether the telecentricity ΔM calculated from the equation (2) is within the predetermined tolerance. Only when the telecentricity ΔM exceeds said tolerance, the main control unit 15 calculates the inclination angle of the flat plate 33c based on said telecentricity ΔM. The flat plate 33c is inclined according to the result of said calculation, thereby correcting the telecentricity of the beams LB1p, LB2p. The telecentricity of the beams LB1p, LB2p emerging from the position detecting system 33x is similarly measured, and correction is made only when the telecentricity exceeds the tolerance. As a result, the symmetry of the incident angles θa, θb of the beams LB1p, LB2p entering the wafer can be precisely maintained, and the telecentricity of the beam SP is automatically corrected simultaneously with the correction of telecentricity of the beams LB1p, LB2p.

The present step 100 allows rapid and precise measurement and correction of telecentricity, since the operation merely consists of moving the reference member 10 in the Z-direction, utilizing the beams LB1p, LB2p of wider effective detection range in the Z-direction (depth of focus about 300 μm) in comparison with the beam SP having the depth of focus of about 20 μm. The telecentricity checking for the SSA system is thus completed.

Step 101—Change to LSA system:

The main control unit 15 controls the rotation of the shutters 24, 25, thereby closing the optical path of the beam ALs entering the LIA optical system 27 and opening the optical path of the beam ALp entering the LSA optical system. Thus the beam ALp alone enters the LSA optical system 26, whereby the wafer is irradiated by the beam SP, instead of the beams LB1p, LB2p. Thus the switching from the LIA system to the LSA system is completed.

Step 102—Baseline measurement:

The main control unit 15 detects the position of the reticle mark RMy in the Y-direction and the reference position for mark detection of the SSA system in the Y-direction, or the axial position of the beam SP emerging from the position detecting system 33y, thereby calculating the base-line ΔBy in the Y-direction.

Then the substrate 10 is illuminated with the exposure light from below, thereby projecting an image of the cross pattern 10a onto the reticle R through the projection lens PL. The wafer stage WS is moved slightly in the Y-direction so as that the projected image scans the reticle mark RMy (rectangular transparent window), and the illuminating light transmitted by the reticle mark RMy is received by a light amount detecting system 9. The amount of light transmitted is maximum when the projected image coincides with the reticle mark RMy, and decreases depending on the aberration therebetween. Thus, the signal processing circuit 14 calculates the position of the reticle mark RMy in the Y-direction, based on the photoelectric signal from said detecting system 9 and the position signal from the laser interferometer 8. Then measured is the axial position of the beam SP in the Y-direction, utilizing the reference mark 10y formed on the substrate 10. Then the beam SP is made incident on the substrate 10 parallel to the LSA mark 10ys, and the main control unit 15 moves the wafer stage WS slightly in the Y-direction. The diffracted light 35 and scattered light 36 generated from the LSA mark 10ys are received by the photoelectric detector 33i (light-receiving areas 38a, 38b, 39a, 39b). Based on the photoelectric signals SDi, SDr from said detector 33i and the position signal from the laser interferometer 8, the signal processing circuit 14 calculates the position of the LSA mark 10ys. Based on the results of above-explained detections, the main control unit 15 determines the baseline $\Delta By$ of the SSA system in the Y-direction, and also measures the base-line $\Delta Bx$ in the X-direction in the identical manner. For the purpose of improving the precision, it is preferable to repeat the measurement plural times and to store the average as the baseline $\Delta Bx$ or $\Delta By$.

Step 103—Wafer prealignment:

The main control unit 15 executes the prealignment of the wafer, by means of the wafer alignment systems 12, 13 and the SSA system. The wafer alignment systems 12 13 detect the Y-position of two chips positioned close to the external periphery of the wafer and symmetrically with respect to the Y-axis, while the SSA system detects the X-position of a chip positioned close to the external periphery of the wafer and equally distanced from said two chips, in a procedure similar to the step 102. The main control unit 15 calculates the positional aberration (including rotational error) of the wafer with respect to the coordinate system XY, based on the positional information of said three chips, and effects the wafer prealignment based on said positional aberration.

Step 104—Correction of chip arrangement data:

In a procedure similar to the steps 102 and 103, the main control unit 15 measures, by the SSA system, the X-Y coordinate values of at least two chips C on the wafer. For a chip C for which the measurement is impossible or the result of measurement is doubtful due to a random error such as surface irregularity of the wafer, the measurement is repeated again or is conducted on a nearby chip. In order to eliminate the scaling error resulting from the elongation or contraction of water (runout), the positional information (design values) of chips is corrected by the results of measurement mentioned above and by the baselines $\Delta Bx$, $\Delta by$ obtained in the step 102, and thus corrected information is memorized as the arrangement data. Thus, when the wafer stage WS is stepped according to the arrangement map, the wafer marks WMx, WMy are always positioned within $+P/4$ with respect to the beams LB1p, LB2p.

The arrangement map may also be calculated from the result of measurements in the step 103, and, in such case it is possible either to improve the accuracy of calculation of the arrangement map or to reduce the number of chips C to be measured.

Step 105—Change to LIA system:

As in the step 101, the main control unit 15 controls the shutters 24, 25, thereby irradiating the wafer with the beams LB1p, LB2p instead of the beam SP. The switching from the LSA system to the LIA system is thus completed.

Step 106—EGA measurement:

The main control unit 15 measures, by means of the SSA system, the coordinate values of plural (5 to 10) chips C positioned at the center and in the vicinity of the external periphery of the wafer. The wafer stage WS is stepped according to the arrangement data obtained in the step 104, thereby positioning the wafer mark WMy of the chip C to be measured, within $\pm P/4$ with respect to the beams LB1p, LB2p.

Then the wafer mark WMy is irradiated by the beams LB1p, LB2p, and the diffracted light 37 generated from the wafer mark WMy is received by the photoelectric detector 33i (light-receiving area 37D). The signal processing circuit 14 detects the phase difference ($\pm 180°$) between the beam signal SDW from said detector 33i and the beat signal (reference signal) SR from the photoelectric detector 27f, and calculates the Y-position of the wafer mark WMy from said phase difference $\phi w$ not exceeding P/2. Thereafter the main control unit 15 repeats the above-explained procedure, statistically calculating the chip arrangement. The enhancement global alignment (EGA) measurement by the LIA system is thus completed.

Step 107—Wafer exposure:

The main control unit 15 steps the wafer stage WS based on the baselines $\Delta Bx$, $\Delta By$ measured in the step 102 and the chip arrangement calculated in the step 106, and executes exposure by exactly overlaying the projected image of the reticle pattern on the chip C by rotation control of the reticle for each chip.

Step 108—Reticle exchange:

The main control unit 15 discriminates whether the reticle is to be exchanged or not. In case the exposure for the unprocessed wafers in the same lot is to be continued with the same reticle, the step 103 is executed again. Thereafter the steps 103 to 108 are repeated until all the wafers of said lot are exposed. In this manner the overlay exposure can be executed with a high precision and a high speed, without sacrificing the throughput or the accuracy of alignment measurement.

Figure 7:
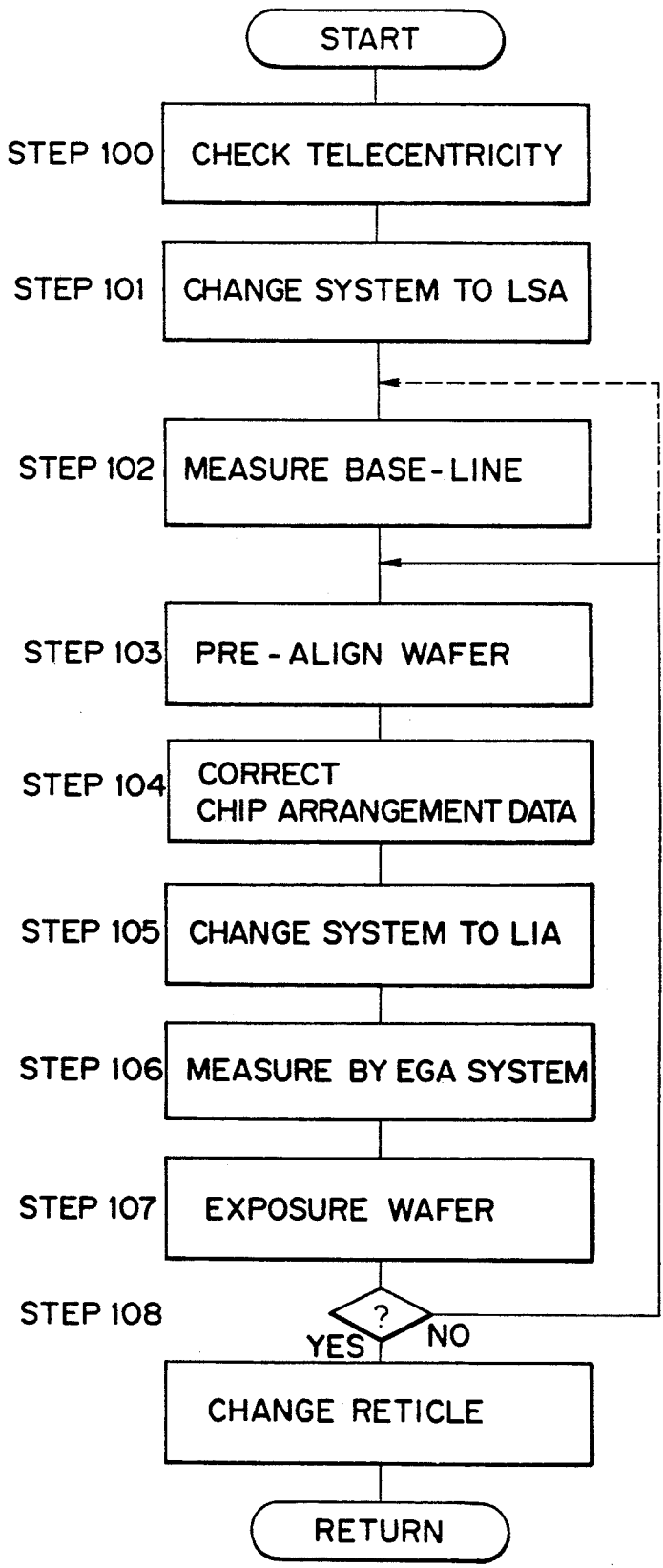
FIG. 7 is a flow chart showing the function of the first embodiment.
Figure 8:
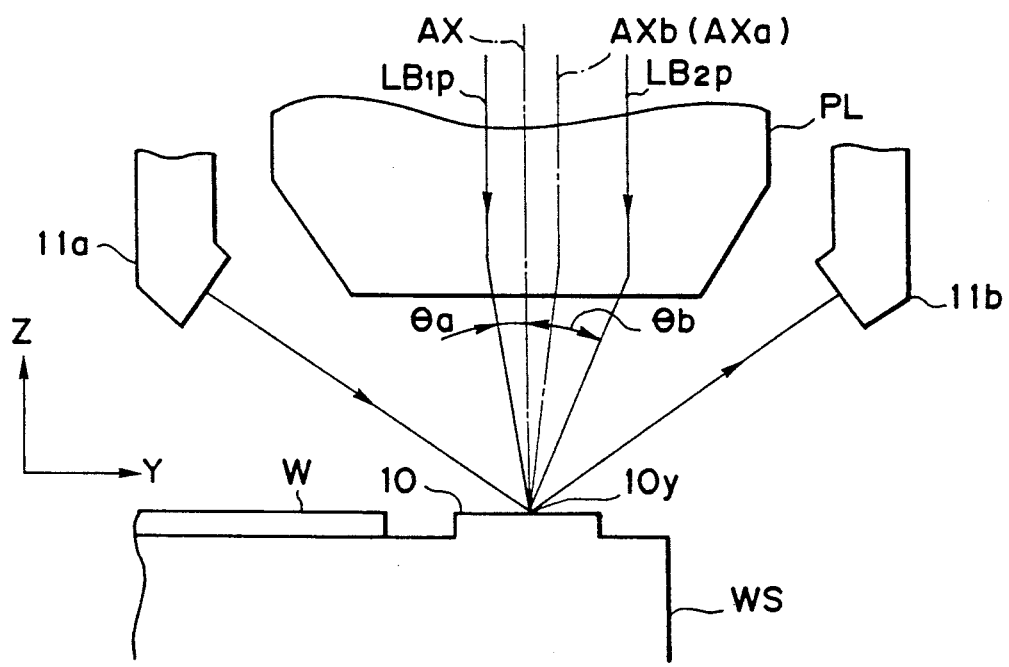
FIG. 8 is a magnified view of the exit portion of a projection lens.

In case the baselines $\Delta Bx$, $\Delta By$ are variable for example by mechanial vibrations, particularly in a stepper employing an excimer laser as the exposure light source in which the baseline drift can take place within a short time, there is preferably employed a sequence which, as indicated by a broken line in FIG. 7, returns from the step 108 to the step 102 instead of the step 103 after the exposure of certain plural (5 to 10 for example) wafers.

In the present embodiment, the wafer mark WMy is shaped identically with the reference mark 10y shown in FIG. 3B, namely consisting of a diffraction grating mark (LSA mark WMys) for the LSA system and a diffraction grating mark (bar pattern) for the LIA system. The LSA mark WMys is less susceptible to the influence of various processes such as the photoresist development, and is stable considerably against edge destruction for example. It is therefore possible to employ a sequence in which, in the measurement of coordinate values of the chip C in the step 104, the main control unit 15 discriminates the surface state of the photoresist layer on the wafer, based on the result of said measurement (for example on the wave form of the photoelectric signal SDi), and the step 105 is executed in succession as explained before if said surface state is unsatisfactory, but the EGA measurement with the LSA system is conducted and is immediately followed by the step 107 without the steps 105 and 106 if said surface state is satisfactory.

The present embodiment employs a He—Ne laser (wavelength 633 nm) as the laser light source 20, but such laser beam of a single wavelength may result in deterioration of the accuracy of alignment, due to eventual interference in the photoresist layer depending on the thickness thereof. In the following there will briefly explained a variation of the foregoing embodiment, capable of eliminating the influence of the interference in the photoresist layer, with reference to FIGS. 11A and 11B in which only shown are the components different from those in said embodiment, and the components common with those in said embodiment are represented by same numbers.

Figure 11A:
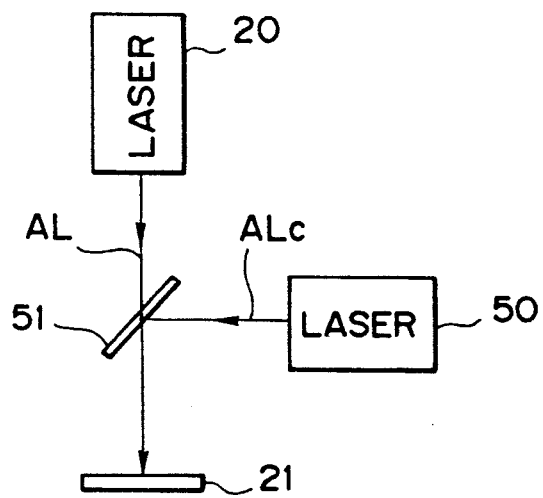
FIGS. 11A and 11B are optical path charts showing partial structures of variations of the first embodiment.
Figure 11B:
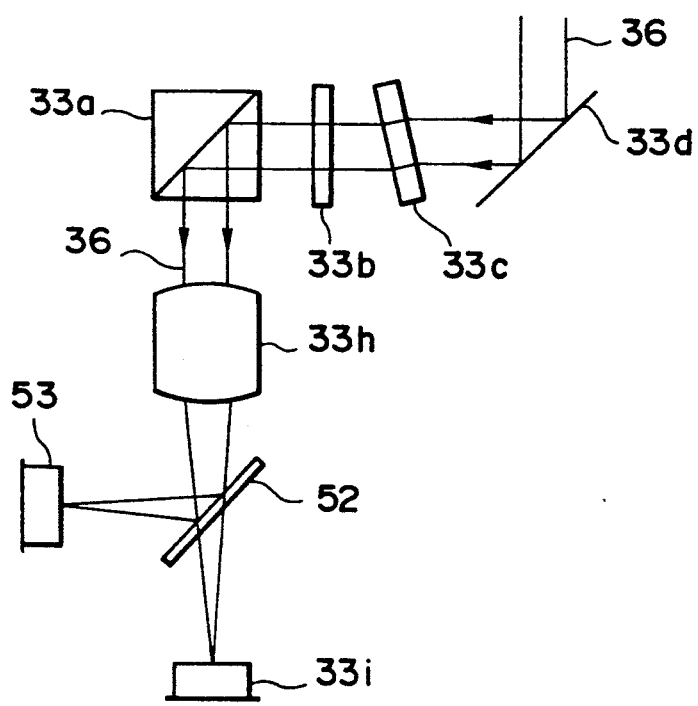

As shown in FIG. 11A there are provided a laser unit 50 composed for example of a He—Cd laser (wavelength 538 nm) as the light source for the SSA system in addition to the laser unit 20, and a dichroic mirror 51 for coaxially introducing the beams AL, ALc from the laser units 20, 50 into the wave plane rotating plate 21. Also in the position detecting system 33y, as shown in FIG. 11B, there are provided a dichroic mirror 52 diagonally in front of the photoelectric detector 33i and a photoelectric detector 53, same as the detector 33i shown in FIG. 6, on a plane conjugate with the pupil, whereby the diffracted light 37 generated from the wafer mark WMy is independently detected by said photoelectric detectors 33i, 53 depending on the wavelengths.

The optical members constituting the SSA system, such as the objective lens 33e, are preferably corrected for color aberration for two wavelengths. If such optical members are not corrected for color aberration, it is also possible to measure, by means of the substrate 10, the wavelength-dependent aberration in the irradiating position of the beam SP and the beams LB1p, LB2p on the wafer, and to provide the main control unit 15 with such aberrations as offset values.

In case of using the beam SP in the above-explained SSA system, the beams AL, ALc are simultaneously emitted from the laser units 20, 50 to form, by teh LSA optical system 26, two beams SP of different wavelengths on the wafer. The optical information (diffracted lights) generated by the wafer mark WMy are received by the photoelectric detectors 33i, 53, depending on the wavelength. The signal processing circuit 14 detects the Y-position of the wafer mark WMy, based on the photoelectric signals from the detectors 33i, 53 and the position signal from the laser interferometer 8. Since two positional information on the wafer mark WMy are simultaneously detected by the detectors 33i, 53, the position of the wafer mark WMy can always be detected precisely even if the beam SP of either wavelength is affected by teh interference in this film.

On the other hand, in case of using the beams LB1p, LB2p, the laser units 20, 50 do not emit the beams AL, ALc at the same time, and the laser unit is switched for example from 20 to 50 only when the influence of interference takes place, and the wafer mark WMy is detected, in the same manner as in the step 106, by the beam ALc from the laser unit 50, namely the beams LB1p, LB2p of wavelength 538 nm. Thus there can be prevented the deterioration in the accuracy of alignment resulting from the interference etc. even in the beams LB1p, LB2p.

When the wavelength of the beams LB1p, LB2p varies, the diffracted light 37 generated by the wafer mark WMy no longer proceeds along the optical axis AX of the projection lens PL and cannot be detected by the detector 33i or 53. Consequently, simultaneous with the switching of the laser units 20, 50, the inclination angles of the flat plates 46, 47 are adjusted according to the equation (1) thereby maintaining the crossing angle $\theta$ of the beams LB1p, LB2p at an optimum value and causing the diffracted light 37 to proceed along the optical axis AX.

Also in the two-beam frequency shifter 27a shown in FIG. 5, the AOM's 45a, 45b release primary beams LB1, LB2 deflected by diffraction angles determined by the frequencies f1, f2. Consequently a change in the wavelength of the beam ALs induces changes in the diffraction angles of the primary beams in the AOM's 45a, 45b, so that the detectors 33i, 53 become unable to detect the diffracted light 37. Consequently, also in said frequency shifter 27a, the frequencies f1, f2 of the drive signals SF1, SF2 for the AOM's 45a, 45b are subjected to fine adjustments according to the wavelength of the beam ALs, so as that the AOM's 45a, 45b have constant diffraction angles for the primary light.

As explained in the foregoing, the first embodiment of the present invention employs the LIA system utilizing so-called heterodyne method in which a predetermined frequency difference $\Delta f$ is given between two beams LB1p, LB2p, but similar effects can naturally be obtained with a LIA system utilizing so-called homodyne method in which the frequency difference is not given to the beams LB1p, LB2p but the position of the diffraction grating mark is detected by moving said diffraction grating mark (wafer mark) in the direction of pitch thereof with respect to stationary interference fringes.

Also the LIA system in the present embodiment is combined with the LSA system, but it may also be combined for example with a TTL alignment optical system for irradiating a predetermined area on the wafer with illuminating light (exposure light or laser beam from a He—Cd laser) through the projection lens PL, receiving the light from the wafer mark with an image sensor such as a television camera or a CCD through a focus plate having a predetermined index mark and position in conjugate relationship with the wafer surface, and processing thus obtained image signal. In case the illuminating light is different in wavelength from the exposure light, for example the light obtained from a He—Ne laser, an aberration correcting optical system is provided in the alignment optical system.

It may furthermore be combined with a wafer alignment system 12, 13 of spot scan method employing a vibrating mirror as shown in FIG. 2, or with a wafer alignment system of stage scan type such as the LSA system or of off-axis type employing the above-mentioned image signal processing.

Also in the present embodiment, the diffraction grating mark (dot mark) for the LSA system and the diffraction grating mark (bar pattern) for the LIA system are integrally formed as the wafer marks WMx, WMy, but similar effects can be obtained even when both diffraction grating marks are separately formed on the wafer if the design distance of said marks is memorized as the offset value. Also the diffraction grating mark for the LSA system, consisting of plural dots arranged in the longitudinal direction of the spot of the beam SP, may be replaced by a bar pattern extended in said direction.

Since the wafer is subjected to various processes such as the photoresist development, the reticle mark of 1:1 duty ratio is not necessarily reproduced with the same duty ratio in the wafer mark. It is therefore desirable to predict the change in the duty ratio in said processes, and to form the reticle mark, based on such prediction, so as to obtain 1:1 duty ratio in the wafer mark. Furthermore, even the wafer mark with 1:1 duty ratio may become unable, in relation to the thickness of the photoresist layer, to provided a high-contrast beat signal SDw due to the loss in intensity of the diffracted light 37 from the wafer mark. In such case it is desirable to determine the duty ratio of the wafer mark providing the highest intensity of the diffracted light in relation to the thickness of the photoresist layer, and to form the reticle mark, taking into consideration the change in duty ratio by the aforementioned various processes, so as to form the wafer mark with such optimum duty ratio.

In the following there will be explained a second embodiment of the present invention.

Figure 12:
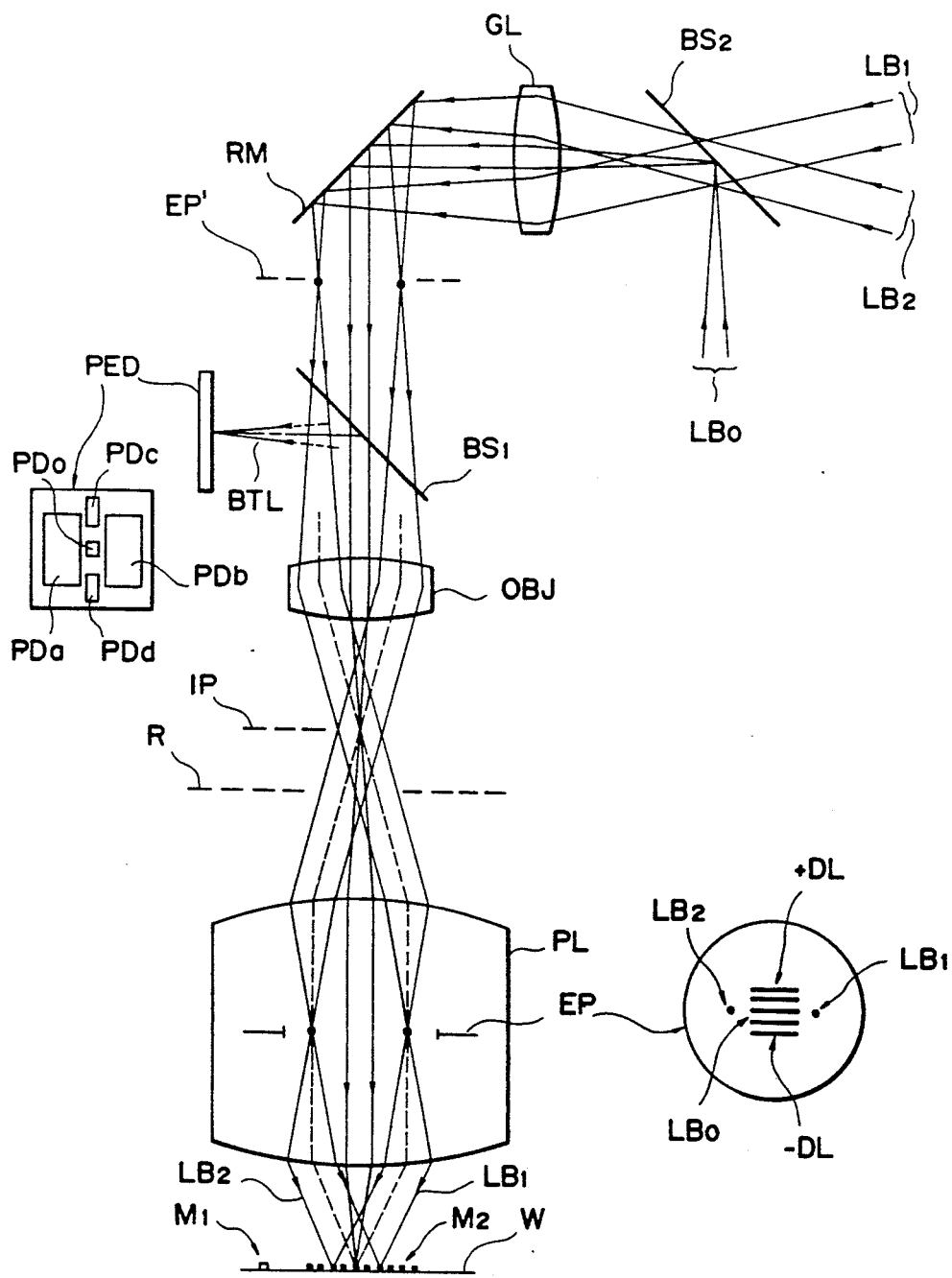
FIG. 12 is a view showing the principle of a second embodiment of the present invention.

FIG. 12 illustrates the basic structure of the present embodiment. On the wafer W there are formed a main mark M2 consisting of a diffraction grating pattern, and a sub mark M1 at a predetermined distance therefrom. The projection lens PL is positioned between the wafer and the reticle R, maintaining said wafer and said reticle in mutually conjugate relationship for the wavelength of the exposure light. The alignment system is composed of an alignment objective lens OBJ, a beam splitter BS1, a mirror RM, a lens system GL, another beam splitter BS2, a photoelectric detector PED etc.

The projection lens PL constitutes a telecentric system at the wafer side. In said alignment system, there are introduced three beams LB0, LB1, LB2, as mark illuminating light beams, of a wavelength different from that of the exposure light.

The beam LB0 is reflected by the beam splitter BS2, then enters the lens system GL, passes through the center of a plane EP' conjugate with the entrance pupil EP of the projection lens PL, then converges on a spatial plane IP by the objective lens OBJ, passes through the center of the pupil EP of the projection lens PL and is refocused on the wafer. Thus the wafer is irradiated by a circular or slit-shaped spot (first detection area) of the beam LB0, and the relative scanning motion of said light spot and the mark M1 on the wafer generates scattered and diffracted lights ±DL from said mark M1. Said reflective diffracted light passes through the projection lens PL and the objective lens OBJ, is reflected by the beam splitter BS1, and the diffracted or scattered light other than the normal reflected light is received by photosensors PDa, PDb, or PDc, PDd of the photoelectric detector PED conjugate with the entrance pupil EP.

The above-mentioned beam LB0, beam splitters BS1, BS2, lens system GL, objective lens OBJ, and photosensors PDa, PDb, PDc, PDd constitute first mark detecting means, as already described for example in the U.S. Pat. No. 4,655,598.

Two coherent beams LB1, LB2, having wavelengths substantially equal to that of the beam LB0 (more strictly frequencies being different by 10-100 MHz as will be explained later), are mutually different in frequency by several KHz to several ten KHz. Said beams enter the lens system GL from two directions through the beam splitter BS2, and form spots symmetrical with respect to the center of the pupil, on the plane EP' conjugate with the pupil. The beams LB1, LB2 then pass through the objective lens OBJ for conversion into corresponding parallel beams, and then mutually cross on the plane IP and enter the projection lens PL.

Said beams LB1, LB2 then converge as spots on the pupil EP, and mutually cross on the wafer, in the form of parallel beams symmetrically inclined with respect to the optical axis of the projection lens PL. The crossing zone of said beams LB1, LB2 corresponds to a second detection area, whereby interference fringes of a pitch corresponding to the crossing angle of said two beams LB1, LB2 moves in one direction on the wafer, with a speed corresponding to the frequency difference. When the main mark M2 is present in said interference fringes, the 1st-order diffracted light vertically generated by the irradiation with the beam LB1 interferes with that vertically generated by the irradiation with the beam LB2, and the interference beat light BTL resulting therefrom perpendicularly enters the projection lens PL. Said interference beat light BTL is guided through the objective lens OBJ and the beam splitter BS1 and condensed as a spot on the photosensor PD0 on the optical axis of the photoelectric detector PED.

The above-mentioned beams LB1, LB2, beam splitters BS1, BS2, lens system GL objective lens OBJ and photosensor PD0 constitute second mark detecting means.

The plane IP is axially aberrated from the reticle, because of the color aberration, due to the difference in wavelength between the beams LB0, LB1, LB2 and the exposure light. The main mark M2 has a periodical structure extended in the lateral direction in the drawing, and the elements of diffraction grating extend perpendicularly to the plane of drawing. The spots of the beams LB1, LB2 are arranged in the direction of pitch of the grating of the main mark M2 in the pupil EP.

The beam LB0 is shaped for example by a cylindrical lens so as to form a slit-shaped spot in the pupil EP, and then enters the beam splitter BS2. Thus the beam LB0 forms, on the wafer, a slit-shaped spot extended perpendicularly to the longitudinal direction of the pupil EP.

The first mark detecting means is exclusively used for detecting the auxiliary mark M1 thereby specifying positional aberration by a multiple of ±P/4 of the main mark M2, while the second mark detecting means is used for detecting positional aberration within ±P/4 of the main mark M2.

As explained above, the present embodiment enables continuous mark detecting operation by combining the auxiliary alignment system based on the first mark detecting means and the main alignment system based on the second mark detecting means, thereby preventing significant loss in throughput and ensuring main alignment.

Figure 13:
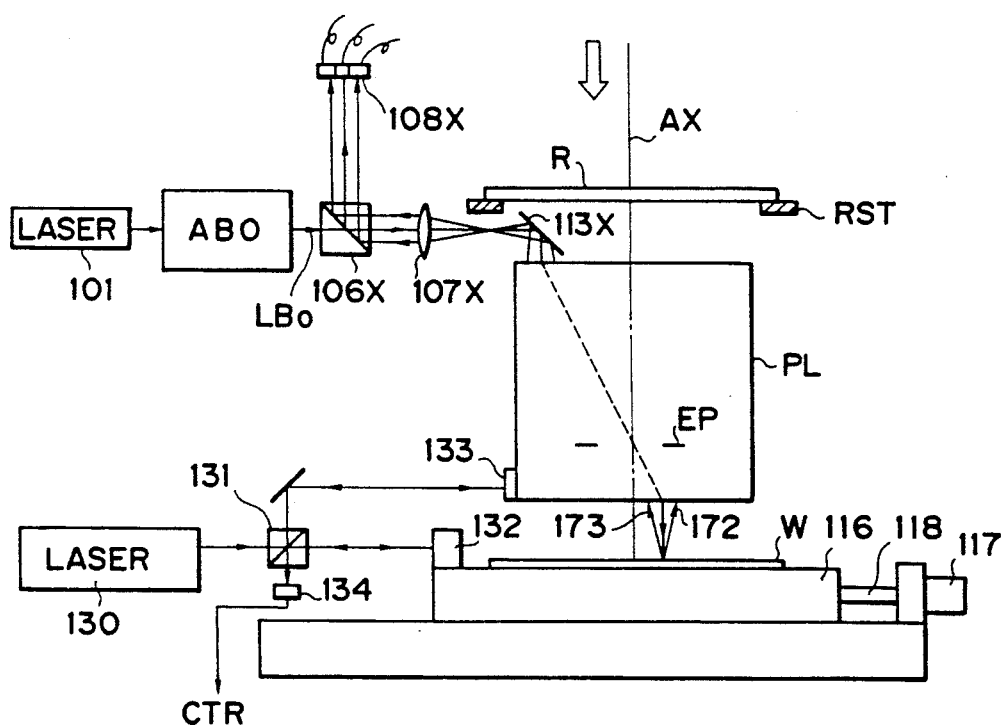
FIG. 13 is a schematic view of the structure of the apparatus constituting said second embodiment.

In the following there will be explained an alignment apparatus employing the present embodiment, with reference to FIGS. 13 to 17. FIG. 13 illustrates an alignment system of a projection exposure apparatus, wherein a reticle R is fixed on a reticle stage RST and precisely positioned in advance with respect to the optical axis AX of a projection lens PL. A wafer W is placed on a two-dimensionally movable stage 116, which performs high-speed movement along the horizontal plane by means of a drive system composed of a motor 117, a feed screw 118 etc. The coordinate position of the wafer stage is measured from time to time by a laser interferometer consisting of a laser unit 130, a beam splitter 131, a movable mirror 132 fixed to the wafer stage, a fixed mirror fixed on the projection lens PL, and a receiver 134 for photoelectrically detecting the interference fringes. The signal from the receiver 134 is supplied to an interferometer counter, whereby the amount of movement of the stage is measured with a resolving power for example of 0.02 μm.

A beam from an alignment laser unit 101 enters a beam transmitting optics ABO for conversion into illuminating beams LB0, LB1, LB2 respectively suitable for the first mark detecting system and the second mark detecting system. Said beams are guided through a beam splitter 106X, an objective lens 107X and a mirror 113X, and enter off-axial positions (around the projection field) of the projection lens PL. Two beams LB1, LB2 are not illustrated as they are positioned on both sides of the beam LB0 perpendicularly to the plane of FIG. 13.

The beam LB0 passing through the center of the entrance pupil EP of the projection lens PL forms a slit-shaped light spot telecentrically illuminating the wafer. Thus, on the wafer, there is formed a beam spot 171 as shown in FIG. 14, of which longitudinal axis is directed toward the optical axis AX of the projection lens PL.

Figure 14:
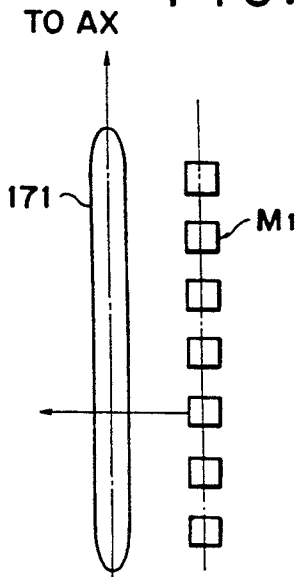
FIG. 14 is a view of a mark detecting beam and an auxiliary mark.
Figure 15:
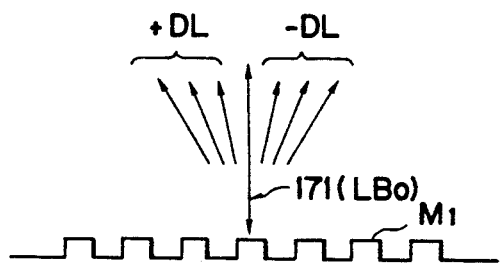
FIG. 15 is a view showing the principle of generation of optical information from the auxiliary mark.

By moving the stage 116, under the measurement with the laser interferometer, in a direction perpendicular to the longitudinal direction of the beam spot 171, the auxiliary mark M1 can be made to pass through said beam spot 171 as shown in FIG. 14. In the present embodiment, the auxiliary mark M1 is composed of a diffraction grating consisting of plural small rectangular patterns arranged with a constant pitch in the longitudinal direction of the beam spot 171, thus having a periodical structure in a direction perpendicular to the direction of pitch of the diffraction grating pattern of the main mark M2. When the spot 171 falls on the auxiliary mark M1, said mark M1 generates diffracted light DL (±1st order, ±2nd order, . . . ) in the direction of pitch of the grating as shown in FIG. 15. Said diffracted light DL is transmitted by the projection lens PL, reflected to the objective lens 107X, reflected again by the beam splitter 106X and reaches the photoelectric detector 108X (PED in FIG. 12). As shown in FIG. 12, said detector 108X is equipped with plural photosensors divided by a plane conjugate with the pupil, for receiving the diffracted lights corresponding respectively to the two alignment systems. The conjugate plane of the wafer (IP in FIG. 12) is present, in case of FIG. 13, between the mirror 113X and the objective lens 107X.

FIG. 13 only illustrates the alignment system and the interferometer for alignment in the X-direction, but there are also provided an identical alignment system and interferometer for the alignment in the Y-direction.

On the other hand, two beams LB1, LB2 from the alignment beam transmitting optics ABO become, as already explained in relation to FIG. 12, parallel beams mutually crossing on the wafer along a plane perpendicular to the plane of FIG. 13, thereby forming an illuminated area (second detection area) sufficiently larger than the beam spot 171. In the present embodiment the spot 171 is positioned at the approximate center of the crossing illumination area of the beams LB1, LB2, but the spot 171 may be present in any position in said area as long as the beam LB0 passes through the center of the pupil EP. However such positional relationship has to be measured in advance by means of another reference mark, such as fiducial mark on the wafer stage.

Figure 16:
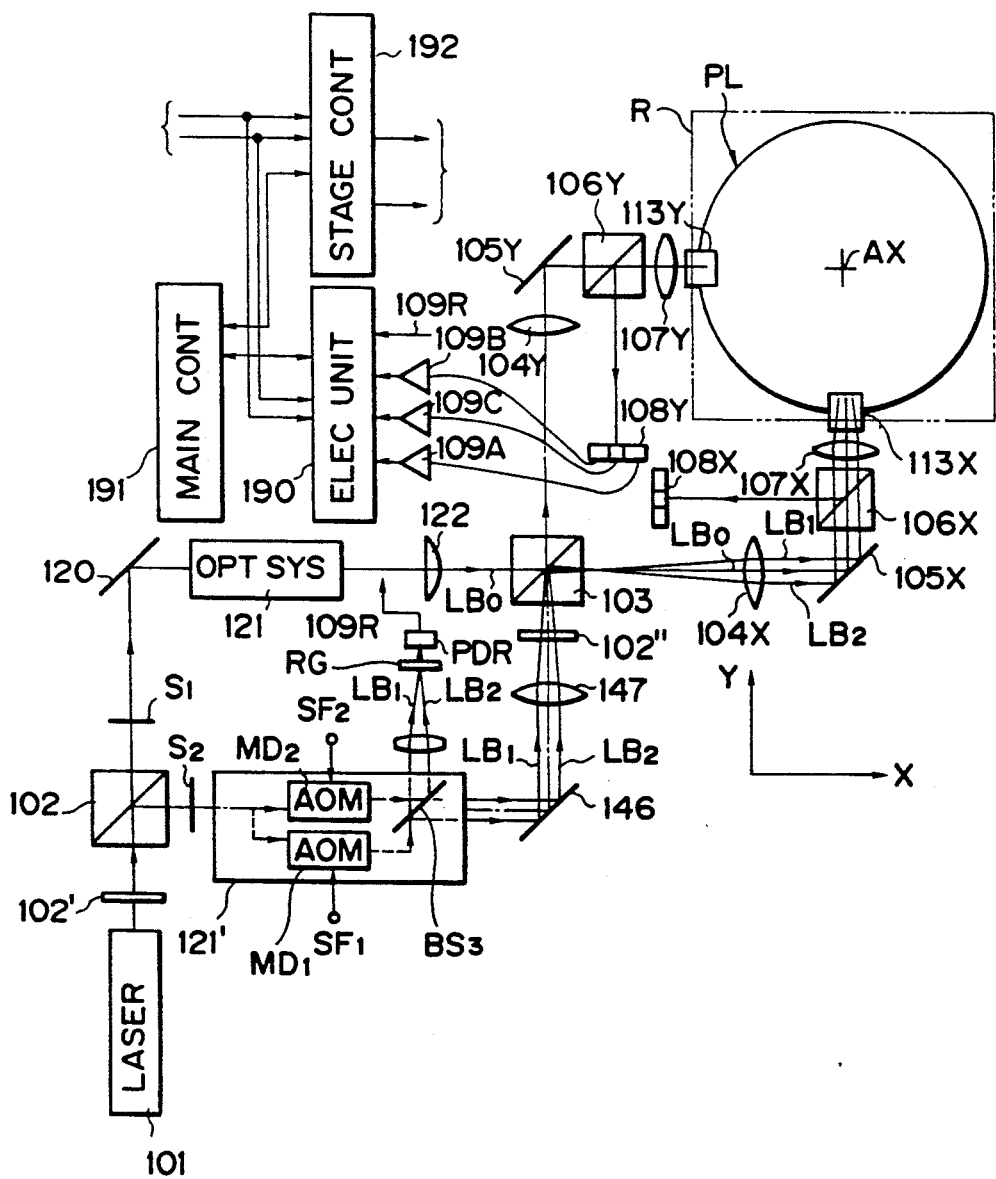
FIG. 16 is a view showing the entire structure of the alignment system in the second embodiment.

FIG. 16 shows the structure of the alignment system employed in the apparatus of FIG. 13, seen on X-Y plane.

A laser unit 101, such as He—Ne laser, Ar laser or He—Cd laser emits a laser beam of a wavelength different from that of the exposure light. Said beam is subjected to the rotation of polarizing direction by about 45° by a ½-wavelength plate 102' capable of small rotation, and is divided into two beams according to the polarizing direction, by a polarizing beam splitter 102. A polarized beam (for example P-polarized) transmitted by said beam splitter 102 passes through a shutter S1, and enters a first beam transmitting system consisting of a mirror 120, a beam shaping optical system 121 and a cylindrical lens 122. The beam LB0 from said cylindrical lens 122 is subjected to amplitude division by a beam splitter 103.

The beam LB0 transmitted by the beam splitter 103 enters an alignment objective system of X-direction consisting of a lens 104X, a mirror 105X, a beam splitter 106X, an objective lens 107X and a mirror 113X. The beam LB0 reflected by the beam splitter 103 enters an alignment objective system of Y-direction consisting of a lens 104Y, a mirror 105Y, a beam splitter 106Y, an objective lens 107Y and a mirror 113Y.

On the other hand, the other polarized beam (for example S-polarized) reflected by the polarizing beam splitter 102 passes through a shutter S2 and enters a second beam transmitting system 121' including two frequency modulators MD1, MD2 such as acoustooptical modulators, and a beam splitter BS3. The beam transmitted by the shutter S2 is divided in two in said transmitting system 121'. The obtained beams are subjected to frequency modulation by the modulators MD1, MD2, and are eccentrically synthesized by the beam splitter BS3. The modulators MD1, MD2 are driven by high-frequency drive signals SF1, SF2 (several ten MHz) of mutually different frequencies, and the difference in frequency becomes the beam frequency (several to several ten KHz). The two beams LB1, LB2 synthesized in the beam splitter BS3 are reflected by a mirror 146, then transmitted by a lens 147 and a polarizing plate 102" and enter the beam splitter 103. The incident plane of two beams LB1, LB2 at the beam splitter 103 is perpendicular to that of the beam LB0. The polarized direction of said two beams LB1, LB2 is matched, by the polarizing plate 102", with that of the beam LB0, and said beams LB1, LB2 are subjected to amplitude division by the beam splitter 103 for entry into the X-alignment objective system and the Y-alignment objective system.

In FIG. 16, the beams LB1, LB2 transmitted by the beam splitter 103 and proceeding to the Y-alignment objective system are omitted. The beams LB1, LB2, represented solely by principal rays, are in collimated state and mutually cross between the lens 147 and the lens 104X or 104Y, and the principal rays are mutually parallel between the lens 147 and the transmitting system 121'. Consequently a plane conjugate with the wafer (namely crossing position of two beams) is present between the lens 147 and the lens 104X or 104Y, and there may be provided an aperture for suitably limiting the illuminated area.

As in the first embodiment, the shutters S1, S2 alternately intercept the beams and are not opened simultaneously.

The two beams LB1, LB2 split from the beam splitter BS3 are collimated by a lens, and enter a reference grating plate RG from two directions with a predetermined crossing angle. On said reference grating plate RG there are formed interference fringes moving with the beat frequency, and a photoelectric detector PDR releases a reference signal 109R by receiving the interference beat light generated by the interference of diffracted lights of same order.

Said reference signal 109R is supplied to an electric unit 190, which also receives output signals from the photoelectric detectors 108X, 108Y through preamplifiers 109A, 109B, 109C etc. In synchronization with the switching control for the shutters S1, S2, said electric unit 190 detects the position of the auxiliary mark M1 or the main mark M2, utilizing the first mark detecting system (stage scan alignment system utilizing the beam spot) or the second mark detecting system (heterodyne alignment system utilizing interference fringes). The positional information thus detected is transferred to a main control unit 191, and is used for controlling a stage motor through a stage controller 192.

In the electric unit 190 there is provided a digital phase meter (or a phase difference calculating software by Fourier conversion) for measuring, within a range of ±180°, the phase difference between the output of the preamplifier 109A for amplifying the signal of the photosensor PD0 (cf. FIG. 12) at the center of the photodetector 108X or 108Y and the reference signal 109R. There are also provided an A/D converter for converting, in response to pulses from the interferometer counter (for example a pulse generated at every stage movement by 0.02 μm), the signal from the preamplifier 109B for amplifying the signals of the photosensors PDa, PDb, or the signal from the preamplifier 109C for amplifying the signals of the photosensors PDc, PDd, into a digital value, and a memory for storing said digital value.

Figure 17:
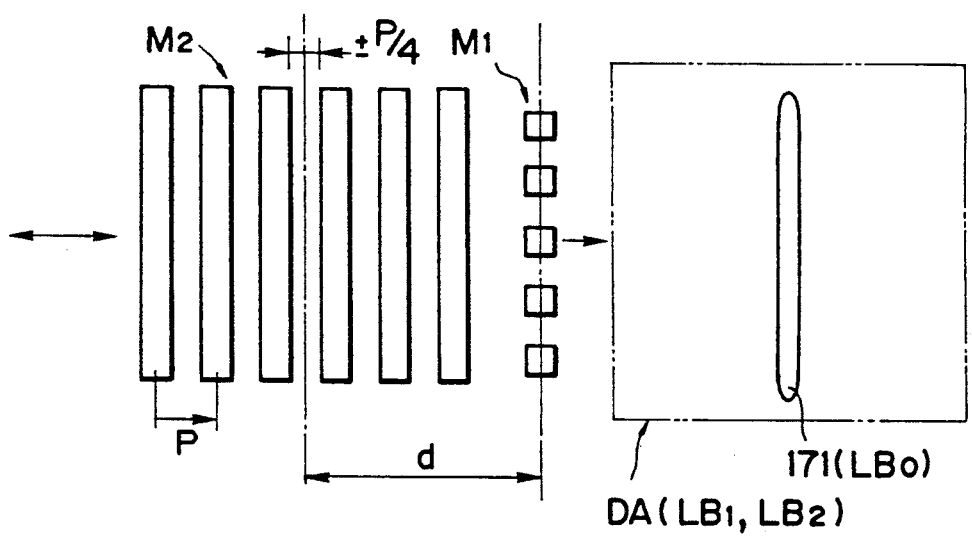
FIGS. 17 and 18 are views respectively showing the structure of the main mark and the mode of auxiliary and main alignment.

FIG. 17 illustrates the arrangement of the auxiliary mark M1 and the main mark M2 on the wafer. The main mark M2 is composed of plural lines and spaces, extended in the longitudinal direction of auxiliary mark M1 and arranged with a pitch P in the position detecting direction of said auxiliary mark M1. The center of the main mark M2 in the detecting direction (direction of pitch) is distanced by d from the center of the auxiliary mark M1. Such set of the main mark M2 and auxiliary mark M1 is formed in advance for each shot area on the wafer.

The spot 171 formed by the beam LB0 and the illuminated area DA by the beams LB1, LB2 are positioned at right of the mark M1. The wafer is moved to the right from such positional relationship. At the same time the shutter S1 is opened while the shutter S2 is closed, thereby forming the spot 171 only on the wafer. After the auxiliary mark M1 crosses the spot 171 and the resulting photoelectric signals (from the photosensors PDa, PDb) are stored in a memory of the electric unit 190, the shutters S1, S2 are switched to form the illumination area DA on the wafer. The wafer continues to move to the right, and stops after a movement by d from the coinciding position of the centers of the spot 171 and the auxiliary mark M1.

Figure 18:
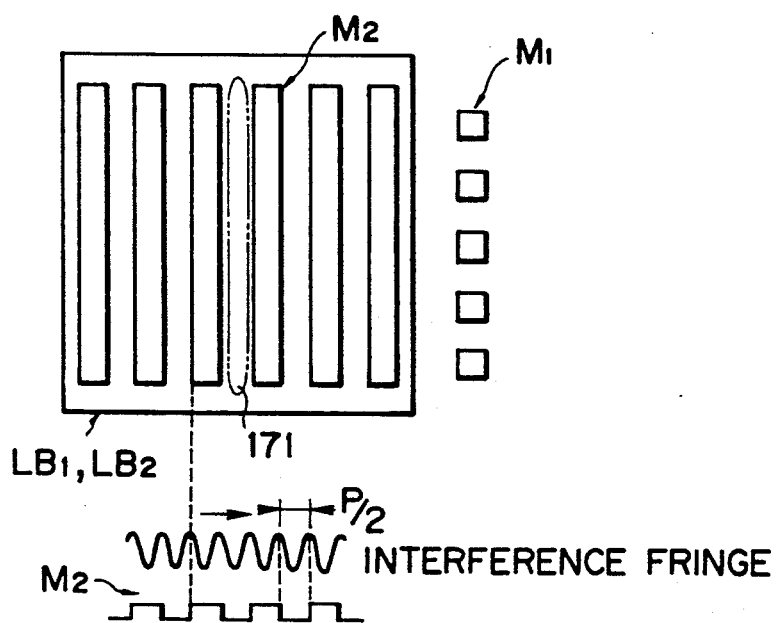

FIG. 18 shows a stopped state of the wafer, wherein the illumination area DA and the main mark M2 are aligned within about ±P/4. The illumination area DA is formed as a clear rectangle, due to the presence of a rectangular aperture at a conjugate position with the wafer, in the transmitting path of the beams LB1, LB2. The illumination area DA is so sized to include the entire main mark M2, but the main mark M2 may be sized larger than said illumination area DA. The number of lines of the diffraction grating of the main mark M2 contained in the illumination area DA has to be so selected as to provide satisfactory S/N ratio in the interference beat light, for example three or more.

In the illumination area DA, there are formed interference fringes extended in the longitudinal direction of the diffraction grating and having a pitch of P/2, and moving in a direction indicated by an arrow. The pitch of the interference fringes is selected as ½ of the grating pitch P in order to obtain the beat light by the interference of the strongest ±1st-order diffracted lights, and such pitch can be obtained by selecting the incident angle $\theta$ of two beams LB1, LB2 into the wafer as sin $\theta = \lambda/P$.

The interference beat light is received by the central photosensor PD0 of the photoelectric detector, thus generating an AC signal of the beat frequency. The electric unit 190 detects the phase difference (±180°) between thus measured signal and the reference signal 109R, and thereby positional aberration, within ±P/4, of the main mark M2 with respect to the reference point. Said reference point corresponds, in the present embodiment, to the reference diffraction grating RG, and the main mark M2 exactly coincides with said reference grating RG if the phase difference is zero.

Figure 19:
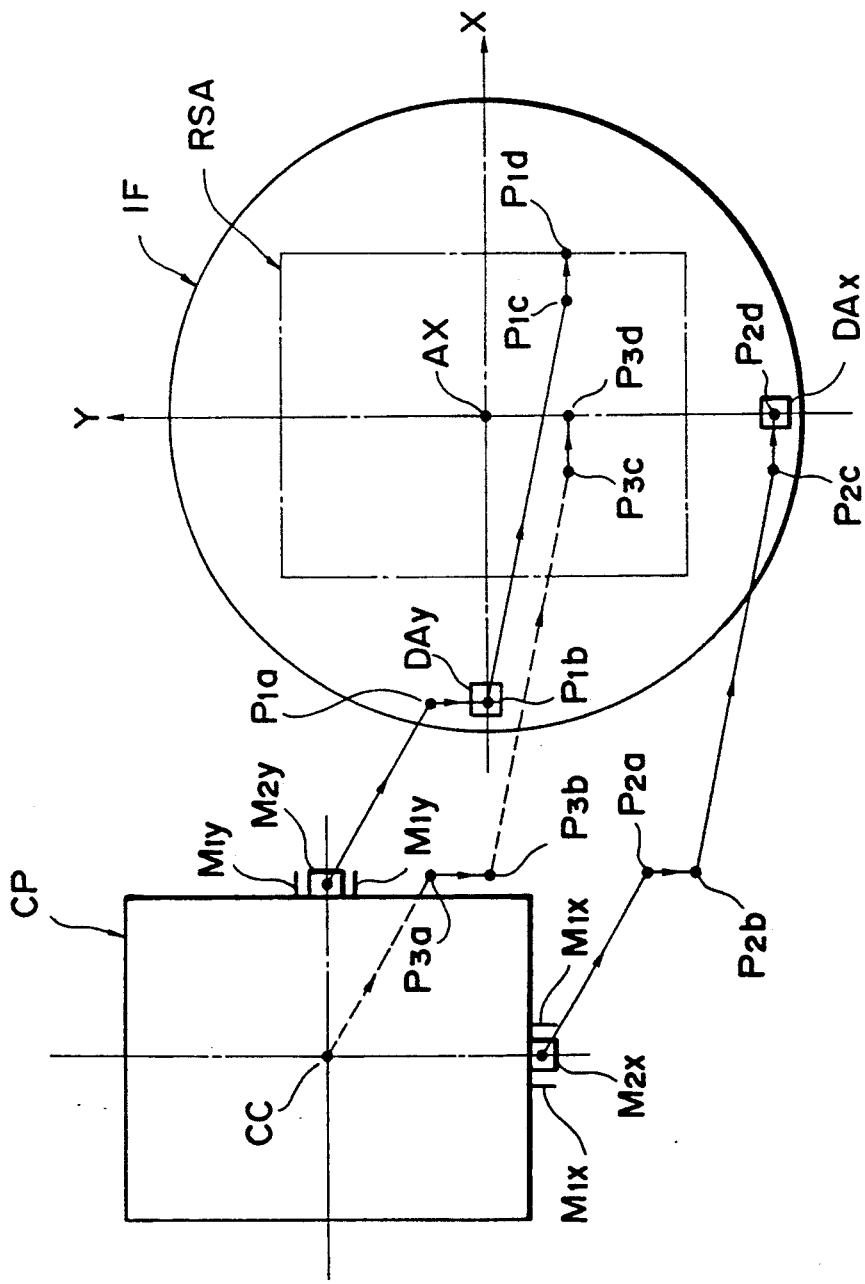
FIG. 19 is a view showing the movement of stage in the alignment operation for a shot.

FIG. 19 shows the mode of stage movement in the measurement, in the X- and Y-directions, of marks on a street line associated with a shot area CP on the wafer. For each shot area CP on the wafer, there are formed a main mark M2x for X-direction and a main mark M2y for Y-direction, respectively on the coordinate axes passing through the center of the shot area. On both sides, in the X-direction, of said main mark M2x there are formed auxiliary marks M1x each spaced by d. On both sides, in the Y-direction, of said main mark M2y there are formed auxiliary marks M1y each spaced by d. The auxiliary marks are formed on both sides of the main mark, in order to use the stage movement in either direction at the mark detection. Naturally there may be provided only one auxiliary mark for each main mark.

The image of the reticle projected through the projection lens PL is usually a rectangular area RSA with the center at the optical axis AX, and is naturally included in the circular field IF of said projection lens PL. When the XY coordinate system is defined with the origin point at said optical axis AX, the X- and Y-axes respectively coincide with the measuring axes of laser interferometers of the stage. The illumination area DAx of the beams LB1, LB2 for X-direction is positioned on the Y-axis toward the outside of the image field IF, while the illumination DAy for Y-direction is positioned on the X-axis toward the outside of said image field IF.

Let us assume that the image field IF and the shot area CP are at first positioned as shown in FIG. 19. The stage is so moved according to the laser interferometers that the center of the main mark M2y passes through a position P1a and stops at a position P1b (center of the illumination area DAy). At said position P1a there is reached the relation shown in FIG. 17, and a movement in the Y-direction to the position P1b provides the relation shown in FIG. 18. In these operations, the main mark M2x moves along a trajectory through P2a, P2b, while the shot center CC moves along a trajectory through P3a, P3b. After the determination of the positional aberration (within ±P/4) of the main mark M2y in the Y-direction in the illumination area DAy, the stage is so moved that the main mark M2x moves from the position P2b to a position P2c and stops at a position P2d (center of the illumination area DAx).

At said position P2c, the main mark M2x and auxiliary mark M1x are in a relation shown in FIG. 17, and the movement from this position to P2d in the X-direction provides a relation shown in FIG. 18.

Then, at the position P2d, the positional aberration of the main mark M2x in the X-direction is determined. After the X- and Y-positions are specified for a shot area CP as explained above, the stage is moved for position measurement of a next shot area CP in a similar manner. However, if the exposure is immediately conducted for the first-mentioned shot area CP, after the determination of positional aberration of the main mark M2x in the X-direction in the illumination area DAx, the stage is slightly moved in the X-direction (within $\pm P/4$) so as that said aberration comes within a predetermined tolerance, and is moved by a predetermined amount in the Y-direction.

Prior to this operation, the shot center CC has passed the position P3c and has reached the position P3d and will be positioned on the Y-axis if the main mark M2x is correctly aligned in the X-direction. Consequently, the shot center CC can be exactly brought to the optical axis AX (center of the projection area RSA) by moving the stage in the Y-direction according to the laser interferometer after the alignment in the X-direction, and the exposure operation can be conducted thereafter.

The amount of said movement in the Y-direction can be defined as $Yb - (Ya - \Delta Y)$, wherein Ya is the Y-coordinate of the stage when the main mark M2y is stopped at P1b, $\Delta Y$ is the measured positional aberration within $\pm P/4$, and Yb is the Y-coordinate of the stage when the mark M2x is stopped at P2d (same as Y-coordinate of the position P1d).

Figure 20:
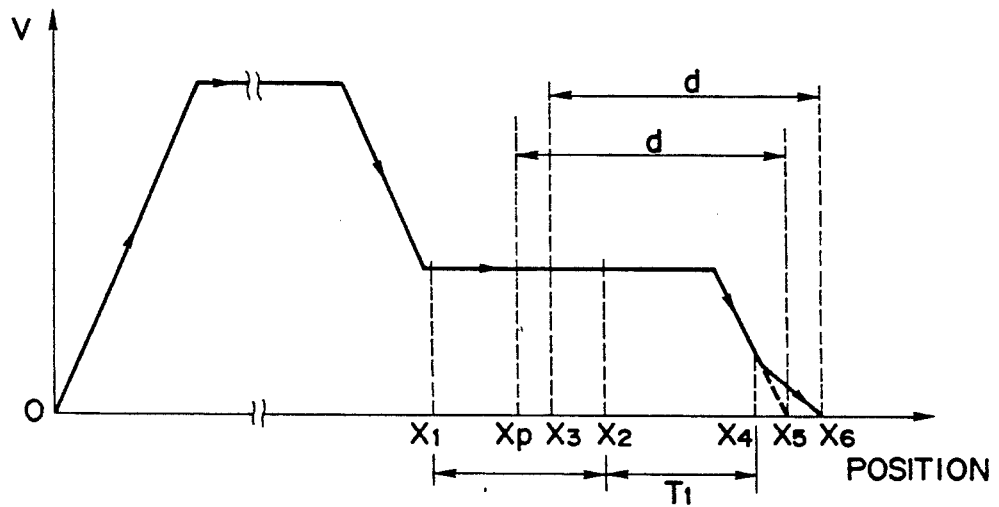
FIGS. 20, 21 and 22 are charts showing speed characteristics representing the stage movements.

FIG. 20 is a chart showing the relation between the moving speed and position of the stage in the mark position detecting operation shown in FIG. 19. The stage, stopped at time 0 at a certain position, is accelerated toward the main mark M2 (or auxiliary mark M1), and decelerated to a constant speed in front of a signal fetching start position x1 for the auxiliary mark M1. The signals from the auxiliary mark M1 are stored in a memory of the electric unit 190 before the arrival at a fetching end position x2. Said start position x1 and end position x2 are determined, based on a predicted position $x_p$ of the auxiliary mark predicted from the global alignment (pre-alignment) of the wafer. After passing through the position x2, the stage continues to move and is so controlled as to stop at a position x5 beyond the estimated position $x_p$ distanced by d. The electric unit 190 executes high-speed processing of the obtained signal after passing of the position x2, and calculates the measured actual position x3 of the auxiliary mark M1 within a processing time T1, which is designed to expire before the stage reaches the planned stop position x5. The main control unit 191 determines an actual stop position x6 (new target) by correcting the estimated stop position x5 by the difference $\Delta x$ between the estimated position $x_p$ and the measured position x3, thereby correcting the drive for the stage. Therefore, when the stage is stopped at the position x6, the center of the main mark M1 is positioned within $\pm P/4$ of the reference point. Subsequently the positional aberration within $\pm P/4$ is measured by the illumination area DA.

The switching of the shutters S1, S2 is conducted between the positions x2 and x6 shown in FIG. 20.

The time from 0 to the position x1 corresponds to the moving time of the main mark M2x from the position P2b to P2c in FIG. 19, and the time from the position x1 to x6 corresponds to the moving time of the main mark M2x from the position P2c to P2d in FIG. 19.

As explained in the foregoing, the present embodiment has an advantage of extremely limited time loss in the wafer alignment sequence, since the mark detections for main alignment and auxiliary alignment can be achieved in a series of stage movements. Also if the processing for determining the measured position of the auxiliary mark is conducted at a higher speed, the distance d between the auxiliary mark M1 and the main mark M2 in the measuring direction can be made shorter, thus enabling further reduction in time. In the chart shown in FIG. 20, the stage speed for auxiliary mark detection is selected lower than the maximum stage speed, but the signal from the auxiliary mark M1 can be obtained at such maximum stage speed if the digitizing of the obtained signal and the storage into memory can be made fast enough.

The auxiliary mark M1 is only provided for specifying the position of the mark M2 within a range of $\pm P/4$, so that the precision of the detecting system for the auxiliary M1, utilizing the spot 171, may be suitably selected to meet the purpose.

For example, if the pitch P is 2 $\mu$m, the precision of detection of the auxiliary mark M1 can be selected at a level of $\pm 0.2$ $\mu$m, with sufficient margin. Consequently, if the auxiliary mark M1 is used for the pre-alignment of the main mark M2, the digital sampling of the signal from the photosensors PDa, PDb of the photoelectric detectors 108X, 108Y may be conducted with less frequency, for example at every movement by 0.08 $\mu$m of the stage. In such case the stage speed can be quadrapled in comparison with the sampling at every 0.02 $\mu$m by the interferometer pulses, though, in practice, the speed is limited by a certain maximum speed.

Also if the width of the auxiliary mark M1 is comparable with that of the spot 171 and is of the order of 2 $\mu$m, it is possible to divide to the frequency of the interferometer pulses at every 0.02 $\mu$m to obtain pulses at every 0.2 $\mu$m, compare the signal level from the photosensors PDa, PDb with a predetermined slice-level at every pulse at the interval of 0.2 $\mu$m, determine the pulse train in which the signal level is higher than said slice level and define the center of said pulse train as the position of the auxiliary mark M1.

In the following there will be explained the alignment by a second method of the present embodiment.

In said second method, the processing of auxiliary alignment is conducted during the main alignment operation, and is completed before the main alignment is completed. The result of auxiliary alignment is fed back to the result of the main alignment, whereby the correct result can be obtained even if the positional aberration of the illumination area DA for main alignment and the main mark exceeds $\pm P/4$. Such method provides an effect of the increase of the processing of the auxiliary alignment in the firm embodiment, thereby further reducing the time required for alignment.

Figure 21:
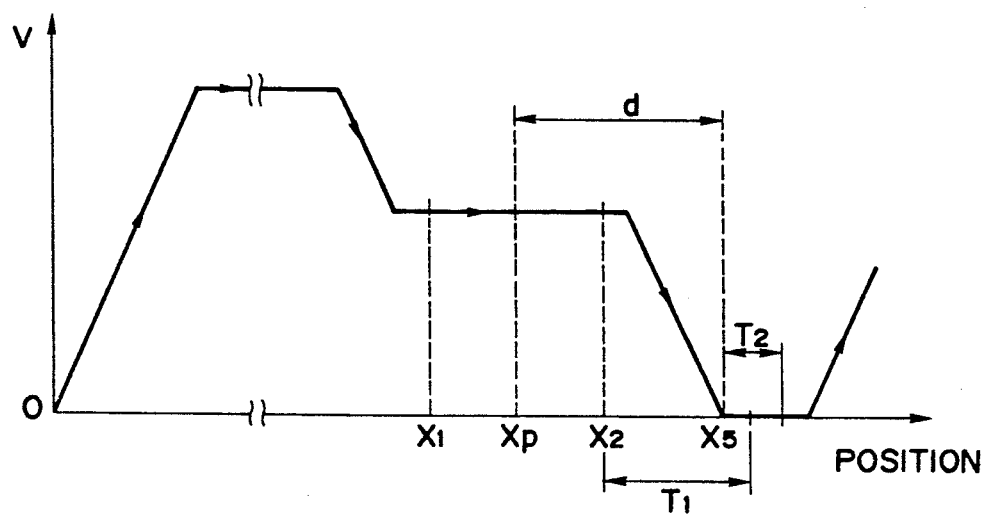

The above-explained method will be explained in further detail, with reference to FIG. 21.

Based on the position information of the main mark M2 and auxiliary mark M1 obtained from the global alignment, the main control unit 191 and the stage controller 192 move the stage, fetching the signal from the auxiliary mark M1 between the positions x1 and x2 in the same manner as in FIG. 20, and stops the stage at the predicted position x5 of the main mark M2, distanced by d from the predicted position $x_p$ of the auxiliary mark M1.

Immediately after passing through the position x2, the electric unit 190 initiates processing for determining the position (x3 in FIG. 20) of the auxiliary mark M1. Also with a time T2 from immediately after the stopping of the stage at x5, a phase meter of the electric unit 190 determines the phase difference between the photoelectric signal corresponding to the interference beat light from the mark M2 and the reference signal 109R, or the positional aberration within ±P/4. The position of the auxiliary mark M1 is specified by the expiration of said time T2.

If the measured position of the auxiliary mark M1 is aberrated by ΔH from the predicted position $x_p$, the main control unit 191 calculates:

$$n = \text{int}\left(\frac{\Delta H}{(P/2)}\right)$$

wherein n is an integer (including zero), and also calculates the final positional aberration:

n·(P/2)+ΔF wherein ΔF is the positional aberration, within ±P/4, obtained in the main alignment.

The above-explained method may be executed without problem even if the time T2 expires before the expiration of the time T1. However the stage movement for next mark measurement has to be started after the expiration of the time T2 for phase difference detection for specifying the position of the main mark M2.

In the following there will be explained a third method of mark detection of the present embodiment. In the first and second methods explained above, the auxiliary alignment is followed by the main alignment, but they may be executed in inverted order. More specifically, the alignment with the main mark M2 is conducted at first in a state shown in FIG. 18, and the auxiliary alignment is then conducted by moving the auxiliary mark M1 to a state shown in FIG. 17. Subsequently the aberration exceeding ±P/4 in the main alignment is corrected by the result of said auxiliary alignment. In this method, the processing for the auxiliary alignment may take somewhat longer, because, in case the alignment is conducted at first for the X-direction and then for the Y-direction, the interval from the X-alignment to Y-alignment, or the interval from the Y-alignment to the alignment for next shot area, or to the exposure, is longer than the moving time required for the distance d shown in FIG. 17.

Figure 22:
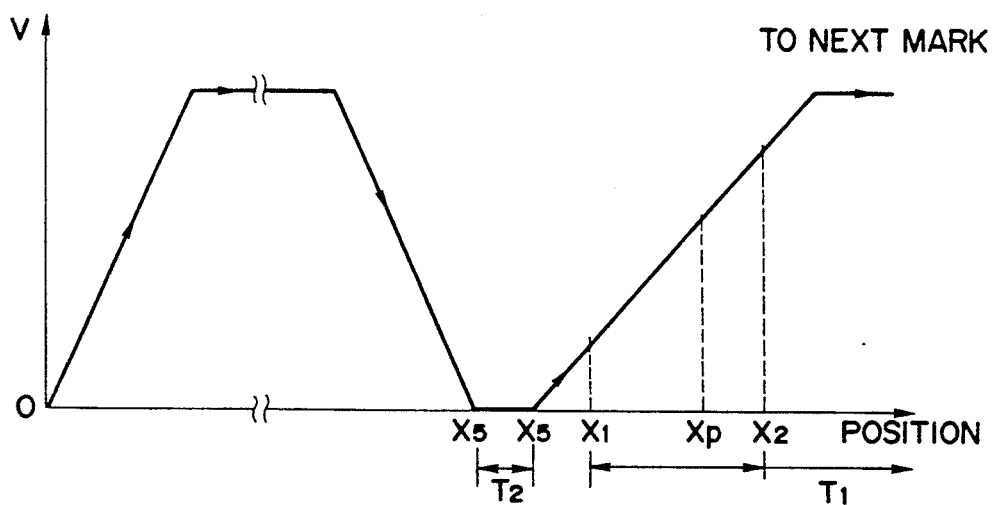

The above-explained method is illustrated in a chart shown in FIG. 22. The stage is stopped at the predicted position x5 of the main mark M2, and the positional aberration of the main mark M2, within ±P/4, is determined within the time T2. The position x5 involves a positional error depending on the precision of the wafer global alignment, but said error can be easily maintained within ±2 μm. Such error scarcely affects the S/N ratio, or amplitude of the interference beat light, since said error causes the displacement between the illumination area DA and the main mark M2 by a pitch at maximum. Consequently the size of the main mark M2 may be selected larger with respect to the illumination area DA, in anticipation of such error (in the precision of pre-alignment or global alignment).

After the determination of positional aberration of the main mark M2 within ±P/4, the spot 171 is formed and the auxiliary mark M1 is moved toward said spot. The signal from the auxiliary mark M1 is fetched during the accelerating period between positions x1 and x2, then the position of the auxiliary mark M1 is specified within a time T1, and, as in the second method, the central position of the main mark M2 is exactly determined by the calculation n·(P/2) +ΔF.

This third method has an advantage of shortest processing time (highest throughput) among three methods, because, in case of detecting plural marks in succession, the stage 16 needs to be stopped only during a time T2. In FIG. 22, the signal fetching takes place during the accelerating period between the positions x1 and x2, but it may also be conducted during the constant-speed movement of the stage as in the first or second method, depending on the distance d between the main and auxiliary marks and on the moving characteristics (acceleration, maximum speed etc.) of the stage.

Figure 23:
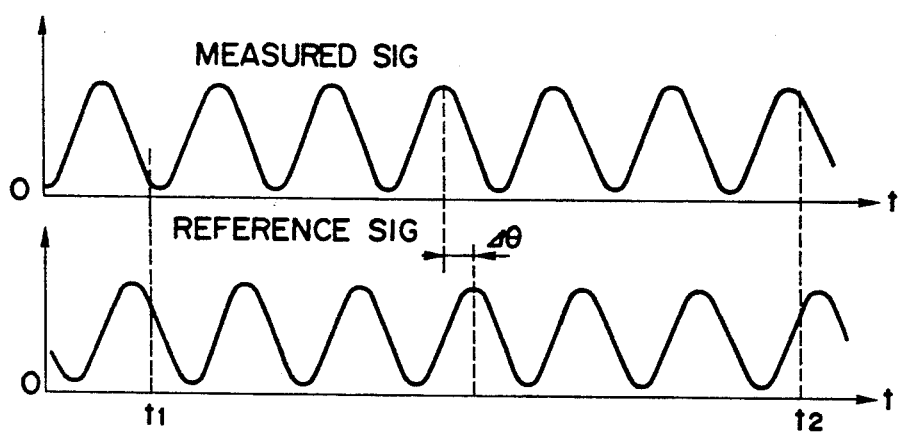
FIG. 23 is a wave form chart showing output in the phase difference measurement.

FIG. 23 shows the wave form of the signal corresponding to the interference beat light from the main mark M2 and of the reference signal 109R.

Within a predetermined period from $t_1$, immediately after the accurate stopping of the main mark M2 in the illumination area DA, to $t_2$, the measured signal and the reference signal are subjected to digital sampling by an A/D converter in response to close pulses of a same time axis, and are stored in the memory. The phase difference Δθ of said two stored signals is determined by a software processing, utilizing, for example, Fourier conversion. In this method, the stage can be moved after the time t2, and the throughput can be improved by starting the stage before the calculation of the aberration of the main mark M2 within ±P/4.

The period from t1 to t2 can be reduced as short as 1-2 msec., by selecting the beam frequency of two signals in the order of 20 KHz and effecting the sampling at 20-40 cycles. Though the subsequent software processing requires 5-10 msec. even with a high-speed processor, such processing does not increase the waiting time because it can be executed simultaneously with the stage movement.

In the following there will be explained the mark structure and photoelectric detection in a fourth method of the present embodiment, with reference to FIGS. 24 to 26.

Figure 24A:
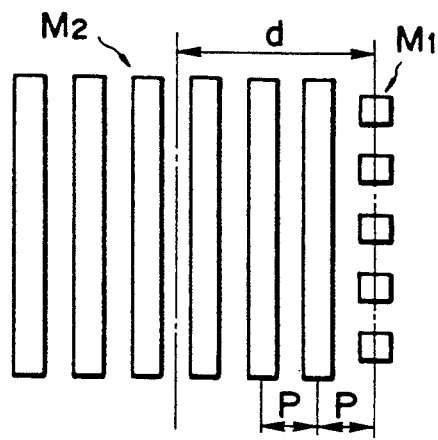
FIGS. 24A, 24B, 25A to 25C are views showing variations of mark structure.

In a structure shown in FIG. 24A, the auxiliary mark M1 is positioned close to the main mark M2, at the grating pitch P thereof, in such a manner that the auxiliary mark M1 itself constitutes a bar in the diffraction grating of the main mark M2. The width of said auxiliary mark M1 is selected same, in the measuring direction, as the width of grating lines of the main mark M2, whereby the auxiliary mark M1 can also contribute to the generation of interference beat light.

Figure 24B:
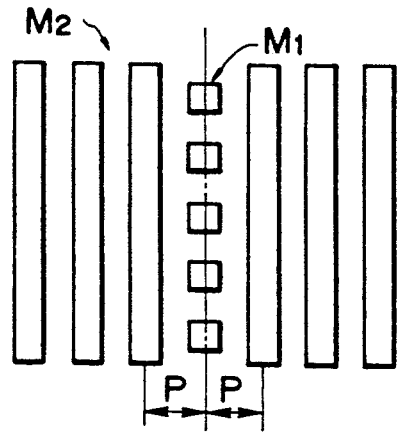

In FIG. 24B, the auxiliary mark M1 is formed as the central grating line of the main mark M2, whereby the center thereof coincides with that of the auxiliary mark M1. Also in this case, the pitch and width of the auxiliary mark M1 is so selected that it can contribute to the generation of the interference beat light.

Figure 25A:
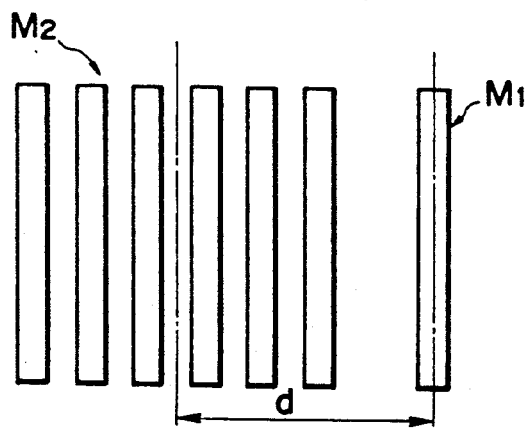
Figure 25B:
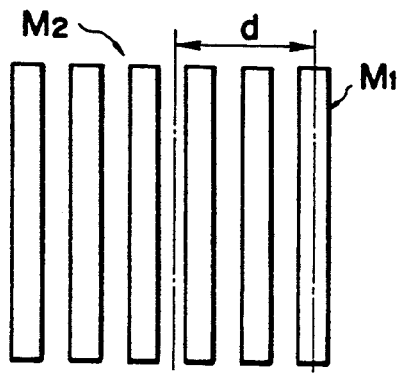
Figure 25C:
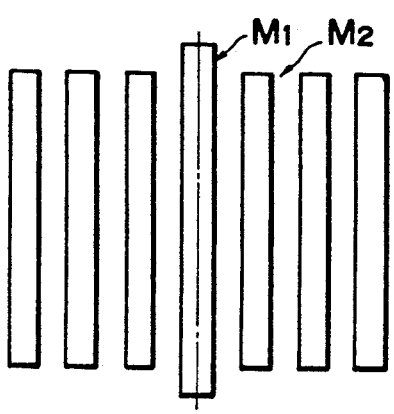

The auxiliary mark M1 may also be composed of a simple line, instead of a diffraction grating. The arrangement of marks in FIG. 25A is same as that in FIG. 17, the arrangement in FIG. 25B is same as that in FIG. 24A, and that in FIG. 25C is same as that in FIG. 24B. In these arrangements, the auxiliary mark M1 has a width same as that of each grating line of the main mark M2, and functions as one of the grating lines of said main mark M2.

The above-explained mark structures provide an advantage of reduced area of the alignment mark on the wafer. Also the structures shown in FIGS. 24B and 25C provide an advantage of easier identification of the center of the main mark M2 at the visual observation.

In the mark structure shown in FIG. 24B, since the spot 171 is positioned at the center of the illumination area DA, it is necessary, after the passing of the auxiliary mark M1 through the spot, to move the stage in opposite direction and to stop the stage within $\pm P/4$, based on the result of auxiliary alignment.

In the mark structures shown in FIGS. 25A-25C, scattered light is generated from both linear edges of the auxiliary mark M1 in the relative movement thereof and the spot 171. Said scattered light can therefore be detected by the photosensors PDc, PDd shown in FIG. 12, and can be subjected to digital sampling in the course of stage movement in response to the interferometer pulses.

FIGS. 26A to 26F show the modes of photoelectric detection by the detectors 108X, 109Y.

FIG. 26A shows the arrangement of the photosensors PDa, PDb, PDc, PDd. The photosensor PD0 is positioned at the center (on optical axis) of the conjugate plane of the pupil. On both sides of said sensor PD0, in the direction of pitch of grating of the main mark M2, which is indicated by an arrow, there are provided two photosensors PDc, PDd. The photosensors PDa, PDb are positioned perpendicularly to said direction of pitch, on both sides of three other photosensors PDc, PDd, PD0.

FIG. 26B shows the distribution of reflected light on the photosensors, in case the wafer is irradiated by the beam LB0 only for detecting the auxiliary mark M1, and the auxiliary mark M1 or other pattern edge is not present in the irradiation area of the spot 171. In this case, since the beam LB0 passes through the center of pupil and telecentrically irradiates the wafer, the 0th-order light 100 along returns to the center of the photoelectric detector.

However, when the auxiliary mark M1, shown in FIGS. 17 or 24, overlaps with the spot 171, the diffracted lights such as 1st-order light $\pm DL1$, 2nd-order light $\pm DL2$, 3rd-order light $\pm DL3$ etc. return to both sides of the 0th-order light 100 as shown in FIG. 26C and are received by the photosensors PDa, PDb.

Also when the grating in the main mark M2 or the auxiliary mark M1, shown in FIG. 25, overlaps with the spot 171, the edge-scattered light 101a, 101b returns, extending in the longitudinal direction of the 0th-order light 100 as shown in FIG. 26D, and is received by the photosensors PDc, PDd.

When the illumination area DA by the beams LB1, LB2 does not include the main mark M2 but merely a reflecting surface, the normal reflected light (0th-order light) of said beams return to the photosensors PDc, PDd as shown in FIG. 26E.

On the other hand, when the main mark M2 is present in the illumination area DA, the interference beat light BTL returns to the photosensor PD0 as shown in FIG. 26F. Said photosensors PD0, PDa, PDb, PDc, PDd are composed for example of photodiodes or PIN photodiodes formed independently on a same semiconductor substrate.

The normal reflected light BL0 of the beams LB1, LB2 returns to the position of the photosensors PDc, PDd, but this is not an essential factor.

In the following there will be explained certain wafer alignment sequences of the present invention, with reference to FIGS. 27A to 27D, in which there may be employed the mark structure and the mark detecting operation in any of the foregoing embodiments.

In the kind of stepper disclosed herein, the exposure operations are repeated by successive stepping operations for plural shot areas CPn on a wafer, and a wafer alignment is executed always before the exposure operation. The alignment sequence can be roughly classified into die-by-die (or field-by-field) alignment in which the mark position is detected for each shot, and global alignment in which the mark position detection is conducted for several representative shots on the wafer.

The mark position detection utilizing the main mark M2 can be employed either in the die-by-die alignment or in the global alignment, but there can be conceived two methods of auxiliary alignment utilizing the auxiliary mark M1 (positioning within $\pm P/4$).

One method is to collectively measure the positions of plural marks by the auxiliary alignment means (first detection means) only, similar to the global alignment, while the other method is to effect the auxiliary alignment for each shot requiring the main alignment, similar to the die-by-die alignment. Consequently, in a stepper equipped with the main alignment means and auxiliary alignment means, there can be conceived four sequences in combination.

Figure 27A:
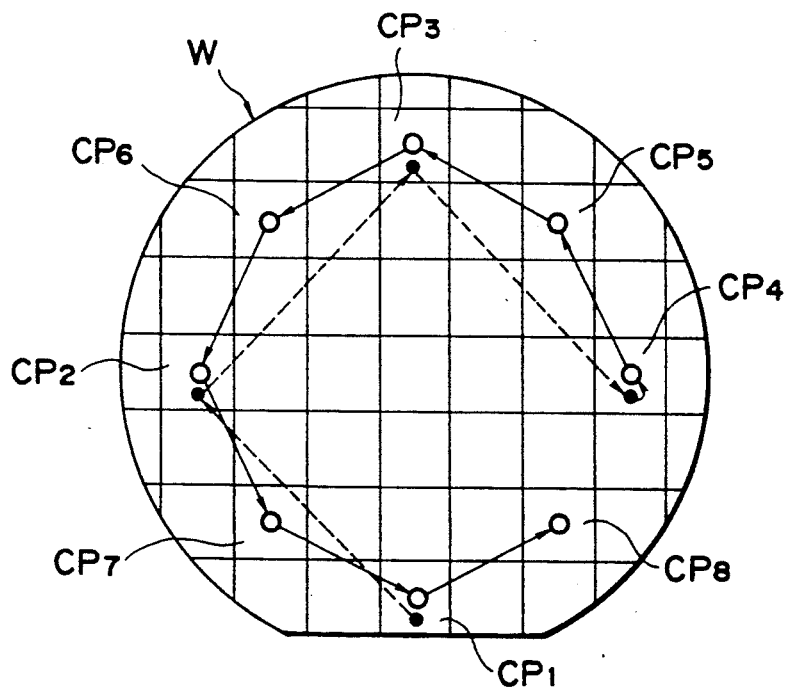
FIGS. 27A to 27D are views showing chip arrangements on the wafer.

FIG. 27A shows a sequence employing global alignment both in the main and auxiliary alignments, wherein the auxiliary alignment (mark position detection) utilizing the auxiliary mark M1 is conducted at four black-circled shots CP1, CP2, CP3, CP4 whereas the main alignment utilizing the main mark M2 is conducted at eight white-circled shots CP1-CP8. The shots CP1-CP4 are positioned on the axes of orthogonal coordinate system in the peripheral area of the wafer, and the shots CP1-CP8 are positioned at approximately same distances from the center of the wafer. The wafer movements to these shots are represented by solid-lined and broken-lined arrows. At first the positions of the auxiliary marks M1x, M1y in the X- and Y-directions are measured in the order of the shot CP1 close to the orientation flat, CP2 at the left end, CP3 at the upper end, and CP4 at the right-hand end. Subsequently, based on the result of said measurements, there is conducted statistical processing in such a manner that the coordinate system of shot arrangement on the wafer and that of stage movement can be correlated with a precision within $\pm P/4$ at any point on the wafer. Subsequent to or simultaneous with said statistical processing, the main alignment with the main mark M2 is executed in the anticlockwise order CP5, CP3, CP6, ..., CP1, CP8, starting from the last shot CP4 in the auxiliary alignment.

Based on the positional aberrations (within $\pm P/4$) in the X- and Y-directions of said eight shots CP1-CP8 obtained in said main alignment and on the result of measurements in the auxiliary alignment, the relative positional relationship between the shot center and the optical axis of the projection lens is precisely specified for all the shot areas on the wafer, and thereafter the stage is stepped according to the reading obtained from the laser interferometers. The sequence shown in FIG. 27A is fastest. Also since the positions of eight shots CP1-CP8 are determined with high accuracy within ±P/4, there can be obtained extremely high precision of alignment by using these values for determining the regularity of shot arrangement by minimum square approximation by enhanced global alignment (EGA) disclosed in the U.S. Pat. No. 4,780,617.

Figure 27B:
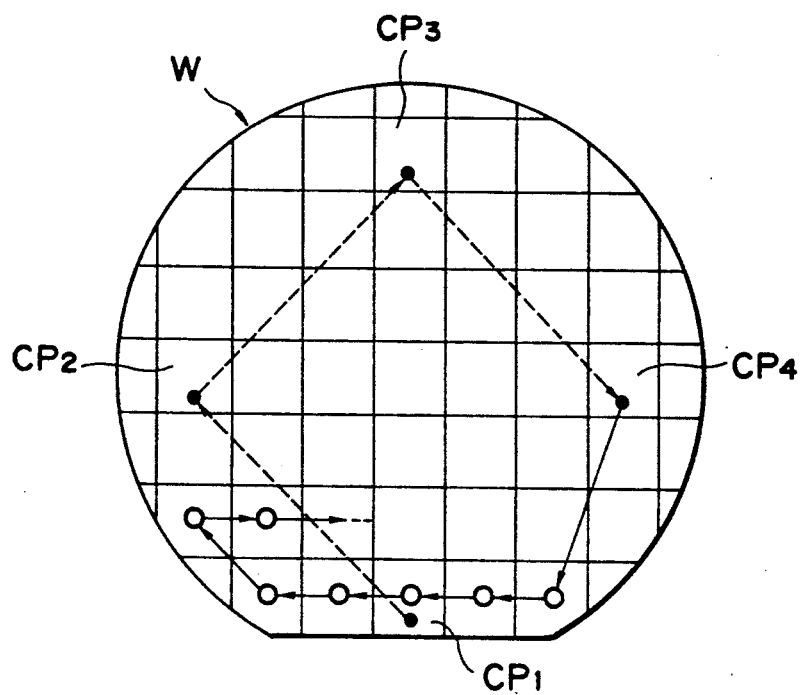

FIG. 27B shows a sequence in which the position of the auxiliary mark M1 is measured by the auxiliary alignment means on four shots CP1, CP2, CP3, CP4 as in the sequence shown in FIG. 27A, and, based on the results of said measurements, the main alignment is executed in the order of step-and-repeat exposures. In this case, the stepping accuracy for the main mark M2 of each shot area has to be within ±P/4. Thus, in the sequence shown in FIG. 27B, the auxiliary alignment is based on global method while the main alignment is based on die-by-die method.

Figure 27C:
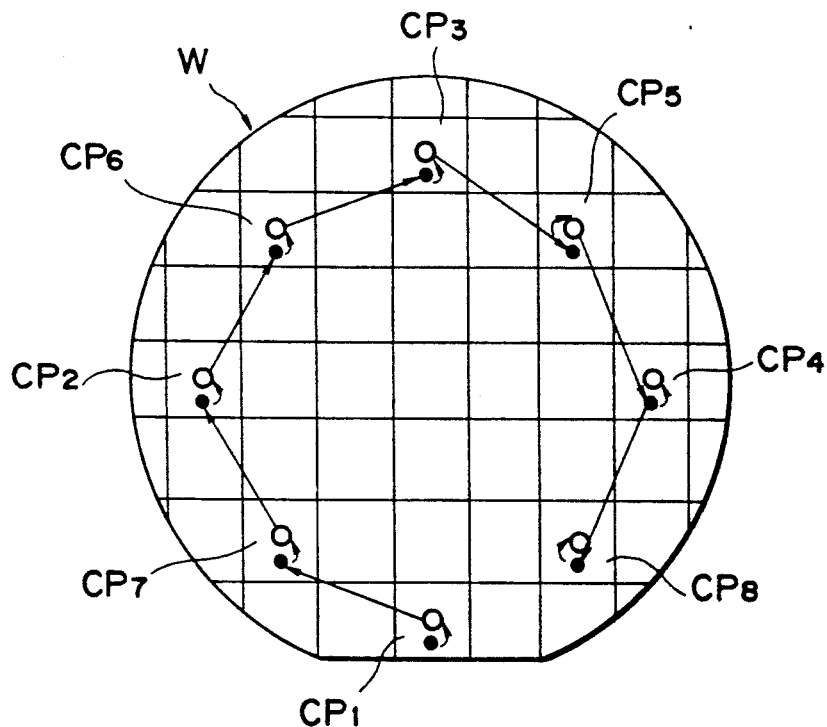

FIG. 27C shows a sequence in which the auxiliary alignment and main alignment are conducted for each of eight representative shots CP1-CP8 on the wafer, prior to exposures.

Figure 27D:
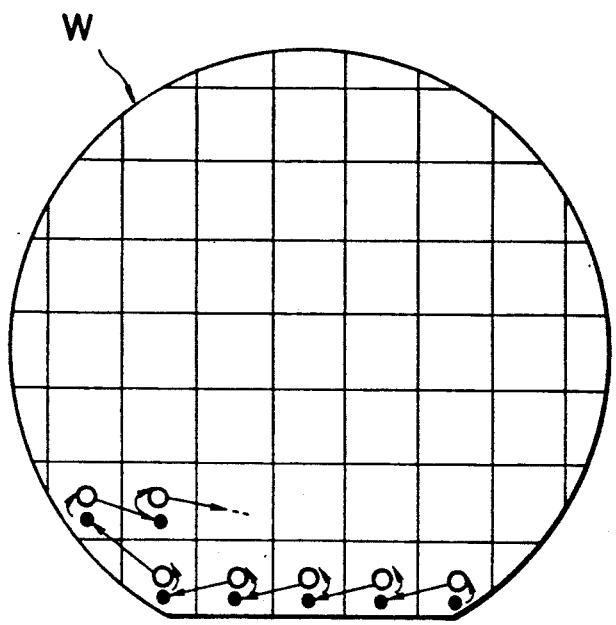

FIG. 27D shows a complete die-by-die sequence in which the auxiliary mark M1 and the main mark M2 of each shot are both detected at the stepping operation of the step-and-repeat exposures.

The number of shots measured in the sequences in FIGS. 27A-27D is preferably varied according to the process for the wafer, and the corresponding ability of the main and auxiliary alignment means. For the auxiliary alignment means, the focusing (vertical movement of Z-stage) is preferably conducted at the scanning of each auxiliary mark M1 because the auxiliary alignment means depends on the spot 171 of the beam LB0 with narrow axial beam waist part. On the other hand, the main alignment means can dispense with the focusing operation as the focus range is relatively wide, because clear interference fringes can be obtained on any plane within the crossing range of two beams LB1, LB2.

The software for the sequences shown in FIGS. 27A-27D is stored in advance in the main control unit 191, and can be selected by the operator. Also in case of handling a large number of wafers in a lot, the sequence for the initial several wafers may be different from the sequence for the remaining wafers.

Figure 28:
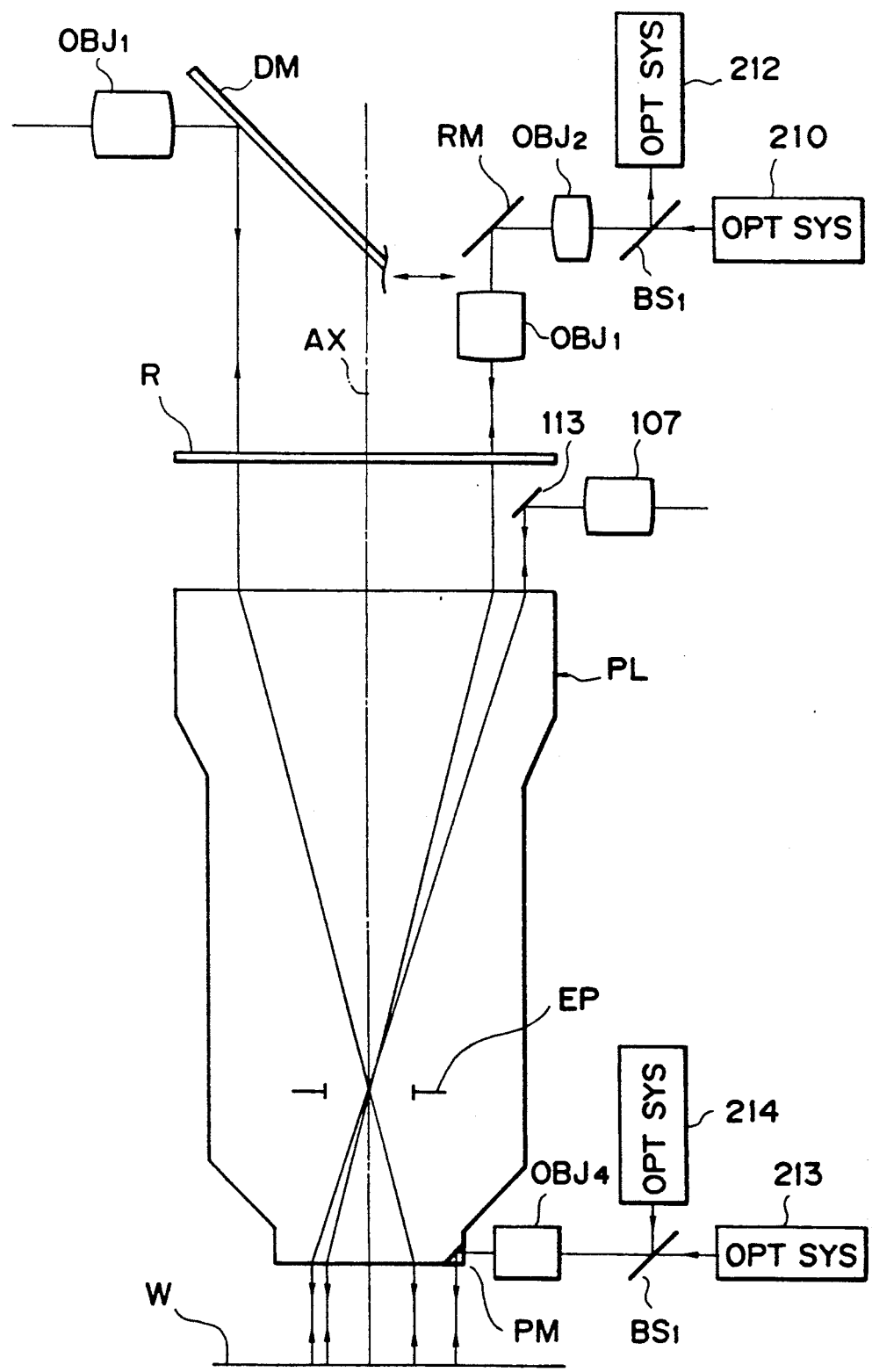
FIG. 28 is a view of the structure of the apparatus constituting another embodiment of the present invention.

FIG. 28 illustrates a stepper incorporating an alignment apparatus constituting another embodiment of the present invention, wherein same components as those in FIG. 13 are represented by same symbols.

The second mark detection means (main alignment means) is composed of an objective lens OBJ1 positioned above the reticle R, a mirror RM, a second objective lens OBJ2, a beam splitter BS1, an emitting optical system 210 and a receiving optical system 212, constituting a TTR (through-the-reticle) system providing similar effects. The objective lens OBJ1 and the mirror RM are made horizontally movable as indicated by an arrow, whereby the position of observation can be changed according to the window position on the reticle.

In the TTR system, the wavelength of the alignment beam from the emitting optical system 210 has to be same as or close to that of the exposure light, in order to simultaneously observe the reticle window and the mark WM on the wafer in a conjugate relation between the reticle and the wafer W through the projection lens PL. If the alignment beam employed in the TTR system has a different wavelength from that of the exposure light, the conjugate relationship between the reticle and wafer becomes aberrated by the color aberration of the projection lens, so that the alignment beam is preferably given double focuses by a double focusing member provided in the emitting optical system 210 or in the objective lens OBJ1.

Also based on the TTR system, the main alignment system can also be obtained by providing a 45°-inclined dichroic mirror DM above the reticle for separating the alignment beam and the exposure light of different wavelengths, and by moving the objective lens OBJ1 from outside into the exposure optical path. In such case the objective lens OBJ1 is rendered capable of parallel displacement in the vertical direction in the drawing, so that the detection of the reticle mark (window) and the mark on the wafer even during the exposure operation.

On the other hand, the first mark detection means (auxiliary alignment system) can be composed of an off-axis alignment system positioned close to the projection lens PL. An off-axis alignment system is composed of a mirror PM diagonally provided at the lower end of the projection lens PL, an objective lens OBJ4, a beam splitter BS1, a light emitting system 213, and a light receiving system 214. In the light emitting system 213 there is provided a system for forming an image of a light source of a broad wavelength distribution, on the pupil (diaphragm plane) of the objective lens OBJ4, and the image of the mark on the wafer is read by an image sensor (for example CCD) in the light receiving system 214. The obtained image signal is processed by an image analyzing circuit or software to determine the position of the center of said mark.

Such off-axis system, not involving the projection lens PL, can utilize a wide wavelength band for the alignment outside the exposure area and is less influenced by the photoresist layer. Also in a system for projecting a slit-shaped beam onto the wafer through the light emitting system 213 and the objective lens OBJ4, there may be incorporated plural wavelengths into said beam by simultaneously lighting plural semiconductor lasers or light-emitting diodes of different wavelengths, thereby achieving the spot scanning operation with little influence by the photoresist layer.

Also in the TTR system or in the off-axis system, the objective lens may be used in common for the auxiliary alignments system and the main alignment system.

In the foregoing embodiment, the main alignment system is based on heterodyne interference alignment, but similar effects can also be obtained by homodyne interference alignment. Such homodyne alignment can be achieved by merely employing an identical frequency for the drive signals SF1, SF2 for two frequency shifters MD1, MD2 shown in FIG. 16. In such case stationary interference fringes are formed on the wafer, and the main mark M2 on the wafer is positioned with respect to said stationary interference fringes, within a range of ±P/4. The photoelectric signal obtained from the photosensor PD0 shows sinusoidal level change by movement of P/2 of the main mark M2, and the wafer stage is so servo-controlled that said level is stabilized at a constant value within ±P/4, for example at the center of amplitude.

Also in such homodyne system, same sequences as in the present embodiment can be realized by memorizing the coordinate position of the stage when the main mark M2 coincides with the stationary interference fringes.

Also in such homodyne system, since sinusoidal photoelectric signal is obtained by moving the main mark M2 relative to the stationary interference fringes, it is also possible to memorize the signal form by digitally sampling the photoelectric signal from the photosensor PD0 in response to the pulses from the laser interferometer (up-down pulses for every movement of ±0.02 μm) in the course of stage movement. In such case the stage position can be determined from the center (or bottom or peak) of amplitude obtained by digital calculation within a cycle of the memorized signal form. This method allows continuous transfer from the auxiliary alignment for detecting the auxiliary mark M2 by stage scanning to the main alignment for signal detection of the main mark M1, without stopping the stage. Naturally an inverted sequence is also possible as already explained in relation to FIG. 22.

In any sequence of the present invention, the signal supplied from the photosensor PD0 to the electric unit 190 for signal processing has to be amplified with an appropriate gain to a level adequate for processing. In the foregoing embodiment, the auxiliary alignment is conducted by the relative movement of the spot 171 of the beam LB0 and the auxiliary mark M1, and has to be repeated if the signal intensity is inappropriate. On the other hand, the main alignment by heterodyne method is conducted in a state in which the main mark M2 is stopped in the illumination area DA of the beams LB1, LB2. In this operation, the complete stopping of the stage 116 requires a certain time after the overlapping of the illumination area DA and the main mark M2. It is possible to reduce the time loss required for gain setting to zero, by starting the signal fetching as shown in FIG. 23 within said time and applying a gain based on thus fetched signal. This operation will be explained in the following, with reference to FIG. 29.

Figure 29:
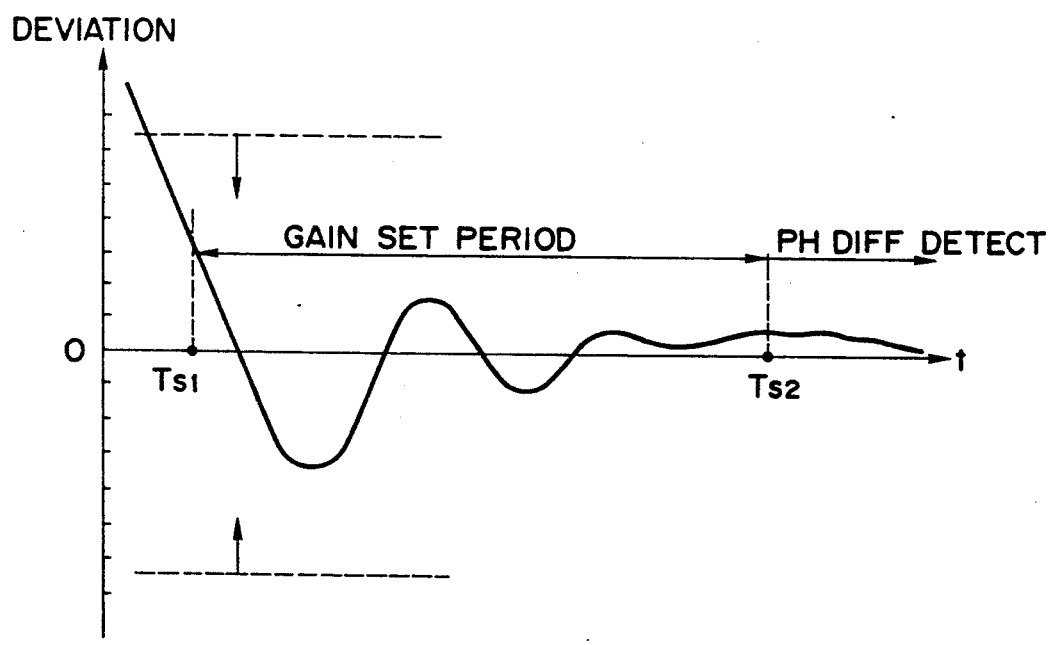
FIG. 29 is a chart schematically showing the behavior of the stage at the stopping thereof.

FIG. 29 shows an example of servo characteristics at the stopping of the stage 116 in somewhat exaggerated manner, in which the abscissa indicates the time while the ordinate indicates the deviation from the target stop position. When the substantially entire main mark M2 is included in the illumination area DA as the stage approaches to the target position, the measured AC signal from the photosensor PD0 shows an approximately stable amplitude. Thus the stage controller 191 sends an instruction to fetch the signal of the photosensor PD0 into the memory of the electric unit 190, starting from a time Ts1 which is within several tens of counts by the laser interferometer before reaching the target value. Then the amplitude of the signal is checked from several bottom and peak values, and the gain of the preamplifier 109A shown in FIG. 16 is switched to obtain a predetermined amplitude. Said gain switching is completed before a time Ts2, and the signal wave sampling for phase difference detection is conducted in continuation. The period from Ts1 to Ts2 is used by the stage controller 191 for confirming the completely stopped state of the stage, and has to be ten to several tens of milliseconds, depending on the stage employed.

It will be apparent that this method is also applicable to the homodyne system.

The stopped stage of the state can also be confirmed by checking the change in phase difference between the signal from the photosensor PD0 and the reference signal from the photodetector PDR. In case of heterodyne system, a movement of the main mark M2 with respect to the illumination area DA induces a slight change in the frequency of the signal from the photosensor PD0, from the original beat frequency by the Doppler effect, thereby generating a change in the difference to the reference signal. Thus the stopped state of the stage can be confirmed if said frequency difference remains within a certain range.

We claim:

1. An apparatus for relative alignment of a first object and a second object, comprising:
   an objective optical system having a first side at which said first object is disposed and a second side at which said second object is disposed, and being telecentric at least at said second side;
   an illuminating system for providing a first coherent light beam passing through a predetermined area of a pupil plane of said objective optical system, and a pair of second coherent light beams passing through two areas substantially point symmetrical with respect to said predetermined area of the pupil plane;
   light receiving means for receiving optical information generated by an alignment mark formed on said second object, through said objective optical system and generating a corresponding output;
   switch means for selectively supplying said objective optical system with said first light beam or said second light beams; and
   means for causing relative movement of said first and second objects in response to the output of said light receiving means.

2. An apparatus according to claim 1, wherein said first light beam passes through an area at the approximate center of the pupil plane of said objective optical system.

3. An apparatus according to claim 1, wherein said pair of second light beams are condensed on the pupil plane of said objective optical system, then respectively collimated and emerge from said objective optical system so as to mutually cross with a predetermined angle.

4. An apparatus according to claim 1, wherein said alignment mark comprises a mark pattern of a periodical structure, and said illuminating system provides said pair of second light beams in such a manner that the direction of a line connecting two areas, on the pupil plane of said objective optical system, through which said pair of second light beams pass, becomes substantially parallel to the direction of periodicity of said mark pattern.

5. An apparatus according to claim 1, wherein said illuminating system comprises means for simultaneously deflecting the angle of a principal ray of said first light beam, and the angles of principal rays of said pair of second light beams, at said second side of said objective optical system.

6. An apparatus according to claim 5, wherein said deflecting means is positioned on a plane optically equivalent to the pupil plane of said objective optical system.

7. An apparatus according to claim 1, wherein said illuminating system comprises light splitting means, and means for introducing said first light beam along a first optical path into said light splitting means and introducing said pair of second light beams into said light splitting means along a second optical path substantially perpendicular to said first optical path.

8. An alignment apparatus comprising:
   a movable stage supporting a substrate having alignment mark means formed thereon including a first mark portion and a second mark portion;

first mark detection means having, at a predetermined position in the moving coordinate system of said stage, a first detection area limited to a size smaller than said second mark portion of said alignment mark means and adapted to detect mark information from said first mark portion of said alignment mark means in said first detection area;

second mark detection means having a second detection area at a predetermined positional relationship with said first detection area and of a size substantially covering said second mark portion of said alignment mark means, and adapted for detecting mark information from substantially the entire second mark portion in said second detection area; and control means for moving said stage by correlating said substrate and said moving coordinate system based on the result of mark detection by said first and second mark detection means.

9. An apparatus according to claim 8, wherein said second mark portion comprises a diffraction grating pattern having a periodical structure in at least one direction, and said second mark detection means comprises means for irradiating substantially the entire are of said diffraction grating pattern with interference fringes of coherent beams, and means for detecting interference light from said diffraction grating pattern.

10. An apparatus according to claim 9, wherein said first mark portion comprises an auxiliary mark arranged at a predetermined positional relationship with said diffraction grating pattern, and said first mark detection means comprises means for measuring the coordinate position of said stage and means for detecting the position of said auxiliary mark based on said measured coordinate position.

11. An apparatus according to claim 10, wherein said control means is adapted to move said stage so as to cause a relative scanning motion between the first detection area of said first mark detection means and said auxiliary mark, either before or after the operation for detecting mark information by said second mark detection means.

12. An apparatus according to claim 8, further comprising an objective optical system, wherein said first and second mark detection means are adapted to detect mark information from said first and second mark portions, respectively, through said objective optical system.

13. An apparatus according to claim 12, wherein said first detection area is included in said second detection area.

* * * * *